(12) United States Patent
Mao et al.

(10) Patent No.: US 9,491,340 B2
(45) Date of Patent: Nov. 8, 2016

(54) MICRO-ELECTRO-MECHANICAL SYSTEM BASED DEVICE FOR ADJUSTING APERTURE AND MANUFACTURING METHOD THEREOF

(71) Applicant: Lexvu Opto Microelectronics Technology (Shanghai) Ltd, Shanghai (CN)

(72) Inventors: Jianhong Mao, Shanghai (CN); Fengqin Han, Shanghai (CN); Deming Tang, Shanghai (CN); Lei Zhang, Shanghai (CN)

(73) Assignee: SHANGHAI JADIC OPTOELECTRONICS TECHNOLOGY CO., LTD., Shanghai (CN)

( * ) Notice: Subject to any disclaimer, the term of this patent is extended or adjusted under 35 U.S.C. 154(b) by 555 days.

(21) Appl. No.: 14/086,493

(22) Filed: Nov. 21, 2013

(65) Prior Publication Data

US 2014/0139727 A1    May 22, 2014

(30) Foreign Application Priority Data

Nov. 22, 2012  (CN) .......................... 2012 1 0480227

(51) Int. Cl.
| | |
|---|---|
| *H04N 5/225* | (2006.01) |
| *G03B 9/02* | (2006.01) |
| *G02B 5/00* | (2006.01) |
| *B81B 7/02* | (2006.01) |
| *H04N 5/235* | (2006.01) |

(52) U.S. Cl.
CPC ............. *H04N 5/2254* (2013.01); *B81B 7/02* (2013.01); *G02B 5/005* (2013.01); *H04N 5/2253* (2013.01); *H04N 5/2353* (2013.01); *G03B 9/02* (2013.01)

(58) Field of Classification Search
CPC ...... G03B 9/02; G02B 5/005; H04N 5/2254; B81B 3/0083; B81B 7/0067; B81B 7/02; B81B 2201/04; B81B 2201/047
See application file for complete search history.

(56) References Cited

U.S. PATENT DOCUMENTS

| | | | | |
|---|---|---|---|---|
| 6,240,962 | B1* | 6/2001 | Tai ............................ | F15C 5/00 137/852 |
| 2004/0201773 | A1* | 10/2004 | Ostergard ............. | G02B 7/102 348/374 |
| 2010/0020991 | A1* | 1/2010 | Chen ..................... | B81B 3/0078 381/162 |
| 2012/0119425 | A1* | 5/2012 | Gutierrez ................. | B81B 7/00 267/140.11 |
| 2014/0139727 | A1* | 5/2014 | Mao ..................... | H04N 5/2254 348/368 |
| 2015/0037024 | A1* | 2/2015 | Zhou ....................... | G03B 9/06 396/510 |

* cited by examiner

*Primary Examiner* — W B Perkey
(74) *Attorney, Agent, or Firm* — Harness, Dickey & Pierce, P.L.C.

(57) ABSTRACT

A micro-electro-mechanical system based device for adjusting aperture and a manufacturing method thereof are disclosed. The system includes: an opaque deformable aperture ring, multiple groups of conductive deformable crossbeams and conductive structs; and one or more fixed parts. In each group, each conductive deformable crossbeam corresponds to a conductive struct. The conductive deformable crossbeams and the conductive structs are arranged around the deformable aperture ring and spaced from each other. The conductive deformable crossbeams are suspended in the air, their inner edges are connected with an external edge of the deformable aperture ring, and their external edges are connected with the fixed parts. The conductive structs are connected with the fixed parts and remain stationary. Electrostatic force between the conductive deformable crossbeam and the conductive struct causes the deformable aperture ring to be stretched and rotate, so that area of an inner bore of the deformable aperture ring is changed.

20 Claims, 12 Drawing Sheets

```
┌─────────────────────────────────────────────────────────┐
│         providing a semiconductor substrate             │──S20
└─────────────────────────────────────────────────────────┘

┌─────────────────────────────────────────────────────────┐
│  etching an upper layer of the semiconductor substrate  │
│  by dry etching or wet etching to form multiple groups  │
│  of conductive deformable crossbeams and conductive     │
│  structs, one or more fixed parts and a central struct, │
│  the central struct being disposed in the center of the │
│  conductive deformable crossbeams and the conductive    │
│  structs, in each group of conductive deformable        │──S21
│  crossbeam and conductive struct, each conductive       │
│  deformable crossbeam corresponding to an adjacent      │
│  conductive struct, the conductive deformable crossbeams│
│  and the conductive structs being arranged around the   │
│  central struct, each conductive deformable crossbeam   │
│  and each conductive struct being spaced from each      │
│  other, external edges of the conductive deformable     │
│  crossbeams being fixedly connected with the fixed      │
│  parts, and the conductive structs being fixedly        │
│  connected with the fixed parts and remaining stationary│
└─────────────────────────────────────────────────────────┘

┌─────────────────────────────────────────────────────────┐
│   adhering a plate on an upper surface of the           │──S22
│             semiconductor substrate                     │
└─────────────────────────────────────────────────────────┘

┌─────────────────────────────────────────────────────────┐
│  thinning a lower layer of the semiconductor substrate, │
│  releasing the multiple groups of conductive deformable │──S23
│  crossbeams and conductive structs to enable the        │
│  conductive deformable crossbeams to be suspended in    │
│                      the air                            │
└─────────────────────────────────────────────────────────┘

┌─────────────────────────────────────────────────────────┐
│  forming an opaque deformable aperture ring around the  │
│  central struct, an external edge of the deformable     │──S24
│  aperture ring being fixedly connected with inner edges │
│  of the conductive deformable cross beams               │
└─────────────────────────────────────────────────────────┘

┌─────────────────────────────────────────────────────────┐
│       removing the plate and the central struct        │──S25
└─────────────────────────────────────────────────────────┘
```

FIG. 1

MICRO-ELECTRO-MECHANICAL SYSTEM BASED DEVICE FOR ADJUSTING APERTURE AND MANUFACTURING METHOD THEREOF

CROSS-REFERENCE TO RELATED APPLICATIONS

The present application claims priority to Chinese patent application No. 201210480227.1, filed on Nov. 22, 2012, and entitled "MICRO-ELECTRO-MECHANICAL SYSTEM BASED DEVICE FOR ADJUSTING APERTURE AND MANUFACTURING METHOD THEREOF", and the entire disclosure of which is incorporated herein by reference.

FIELD OF THE DISCLOSURE

The present disclosure generally relates to the field of semiconductor manufacturing, and more particularly, to a micro-electro-mechanical system based device for adjusting aperture and a manufacturing method thereof.

BACKGROUND OF THE DISCLOSURE

Nowadays, in cell phones or other handheld devices, micro cameras which has a much smaller size than a common camera module, are used more and more widely. Generally, a micro camera module includes an image sensor, one or more image processing chips, a focusing lens system and an aperture system. A fixed aperture system is mainly used in a micro camera which is integrated in a cell phone or other handheld devices due to its size and manufacturing cost limitation.

In practice, a micro device for adjusting aperture becomes a development trend and research focus. To be assembled in a micro camera module conveniently, a device for adjusting aperture should have a small size, low power consumption and low manufacturing cost.

How to realize an aperture adjusting function in a micro camera module which has a very small size, low power consumption and low manufacturing cost has become a problem exigent to be solved.

SUMMARY

Embodiments of the present disclosure provide a Micro-Electro-Mechanical System (MEMS) based device for adjusting aperture and a manufacturing method thereof, where an automatic aperture adjusting function is realized, and power consumption, manufacturing cost and the size of the device are reduced.

According to one embodiment of the present disclosure, an MEMS based device for adjusting aperture is provided, including:

an opaque deformable aperture ring;

multiple groups of conductive deformable crossbeams and conductive structs, where in each group, each conductive deformable crossbeam corresponds to an adjacent conductive struct, the conductive deformable crossbeams and the conductive structs are arranged around the deformable aperture ring, each conductive deformable crossbeam and each conductive struct are spaced from each other, the conductive deformable crossbeams are suspended in the air, and inner edges of the conductive deformable crossbeams are fixedly connected with an external edge of the deformable aperture ring; and one or more fixed parts, where external edges of the conductive deformable crossbeams are fixedly connected with the fixed parts, and the conductive structs are fixedly connected with the fixed parts and remain stationary.

Electrostatic force between the conductive deformable crossbeam and the conductive struct in each group enables the conductive deformable crossbeam to move relatively to the conductive struct, so that the deformable aperture ring is stretched and rotates clockwise or anticlockwise. As a result, an area of an inner bore of the deformable aperture ring may be changed.

By attraction of opposite charges between the conductive deformable crossbeams and the conductive structs, the conductive deformable crossbeams move relatively to the conductive structs gradually, so that the inner edges of the conductive deformable crossbeams drive the external edge of the deformable aperture ring to be stretched in a radial direction and drive the deformable aperture ring to rotate around the center thereof clockwise or anticlockwise. As a result, the area of the inner bore of the deformable aperture ring is changed and the aperture is adjusted. The conductive deformable crossbeams are suspended in the air, and the external edges thereof are fixedly connected with the fixed parts and remain stationary. The conductive structs are fixedly connected with the fixed parts and remain stationary. The fixed parts may improve the stability and accuracy of aperture adjusting of the deformable aperture ring, and provide convenience for the assembly of the MEMS based device for aperture ring.

Optionally, the multiple groups of conductive deformable crossbeams and conductive structs are symmetrically arranged around the deformable aperture ring. Optionally, the multiple groups of conductive deformable crossbeams and conductive structs are arranged around a circle of the deformable aperture ring and rotationally symmetric with respect to the center of the deformable aperture ring. When rotationally stretching the deformable aperture ring, the conductive deformable crossbeams and conductive structs in the rotationally symmetric arrangement enable every side of the deformable aperture ring to share averaged force, which may prevent the deformable aperture ring being damaged and keep the center thereof unchanged.

Optionally, along a radial direction of the deformable aperture ring outwardly, a distance between the conductive deformable crossbeam and the conductive struct in each group may decrease gradually. During a process that the conductive struct attracts the conductive deformable crossbeam, under a relatively small electric potential difference, an external part of the conductive deformable crossbeam nearest to the conductive struct may be attracted approaching the conductive struct or in contact with the conductive struct partially, so that the deformable aperture ring is somewhat rotationally stretched. Then, under a gradually increased electric potential difference, an inner part of the conductive deformable crossbeam far away from the conductive struct may gradually approach the conductive struct due to the electrostatic attraction, so that the deformable aperture ring is further rotationally stretched. In such, the conductive deformable crossbeam may be attracted and an area of the inner bore of the deformable aperture ring may be changed greatly.

Optionally, each of the conductive deformable crossbeams may take a shape of sickle which includes a bending part and a flat part. An inner edge of the bending part is fixedly connected with the external edge of the deformable aperture ring. During a process that the conductive struct attracts the conductive deformable crossbeam, the bending part can rotationally stretch the deformable aperture ring at utmost, so that the area of the inner bore of the deformable aperture ring is changed greatly.

Optionally, along a radial direction of the deformable aperture ring, each conductive deformable crossbeam may have a flat side. Optionally, a cross section of the conductive deformable crossbeam may be a parallel tetrahedron structure which is long and narrow in a vertical direction and a process for manufacturing the conductive deformable crossbeam is simple.

Optionally, the conductive deformable crossbeams may include a plurality of first conductive deformable crossbeams and a plurality of second conductive deformable crossbeams, and the conductive structs may include a plurality of first conductive structs which correspond to the plurality of first conductive deformable crossbeams and a plurality of second conductive structs which correspond to the plurality of second conductive deformable crossbeams. The plurality of first conductive deformable crossbeams and the plurality of second conductive deformable crossbeams are arranged around the deformable aperture ring, and each first conductive deformable crossbeam and each second conductive deformable crossbeam are spaced from each other. The plurality of first conductive structs and the plurality of second conductive structs are arranged around the deformable aperture ring, and each first conductive struct and each second conductive struct are spaced from each other. When the conductive deformable crossbeam and the conductive struct in each group have opposite charges, the first conductive deformable crossbeam and the second conductive deformable crossbeam may have opposite charges, and the first conductive struct and the second conductive struct may have opposite charges, so that the conductive deformable crossbeam has opposite charges with one adjacent conductive struct and has like charges with the other adjacent conductive struct. Therefore, almost all the conductive structs attract their corresponding conductive deformable crossbeams disposed on a same side of them, which ensures the deformable aperture ring to be rotationally stretched towards a same direction, and this is benefit to a change of an area of the inner bore of the deformable aperture ring and to the stability of the center of the deformable aperture ring.

Optionally, in each group of the conductive deformable crossbeam and the conductive struct, each conductive deformable crossbeam corresponds to one adjacent conductive struct. The conductive deformable crossbeams may include a plurality of first conductive deformable crossbeams and a plurality of second conductive deformable crossbeams, and the conductive structs may include a plurality of first conductive structs which correspond to the plurality of first conductive deformable crossbeams and a plurality of second conductive structs which correspond to the plurality of second conductive deformable crossbeams. The plurality of first conductive deformable crossbeams and the plurality of second conductive deformable crossbeams are arranged around a circle of the deformable aperture ring, and each first conductive deformable crossbeam and each second conductive deformable crossbeam are spaced from each other. The plurality of first conductive structs and the plurality of second conductive structs are arranged around the circle of the deformable aperture ring, and each first conductive struct and each second conductive struct are spaced from each other. When electrostatic repulsion occurs between the conductive deformable crossbeam and the conductive struct in each group, the first conductive deformable crossbeams and the second conductive deformable crossbeams may have opposite charges, and the first conductive structs and the second conductive structs may have opposite charges. Optionally, in each group, an inner side of the flat part of the conductive deformable crossbeam may be parallel with an inner side of the conductive struct which is opposite to the inner side of the flat part. When electrostatic repulsion occurs between the conductive deformable crossbeam and the conductive struct, a distance therebetween may be increased, so that the conductive deformable crossbeam has opposite charges with one adjacent conductive struct and has like charges with the other adjacent conductive struct. Therefore, almost all the conductive structs repel their corresponding conductive deformable crossbeams disposed on a same side of them, which ensures the deformable aperture ring to be rotationally stretched towards a same direction. When electrostatic repulsion occurs between the conductive deformable crossbeam and the conductive struct, an inside part of the conductive deformable crossbeam moves away from the conductive struct and then an outside part thereof moves away from the conductive struct gradually, which enables the conductive deformable crossbeam to move under electrostatic repulsion with relatively small intensity and changes the area of the inner bore of the deformable aperture ring, and this is benefit to the change of the aperture and to reduction of power consumption.

Optionally, in each group of the conductive deformable crossbeam and the conductive struct, each conductive deformable crossbeam corresponds to two adjacent conductive structs which are disposed on two sides of the conductive deformable crossbeam. The conductive deformable crossbeams may include a plurality of first conductive deformable crossbeams and a plurality of second conductive deformable crossbeams, and the conductive structs may include a plurality of first conductive structs and a plurality of third conductive structs which correspond to the plurality of first conductive deformable crossbeams and a plurality of second conductive structs and a plurality of fourth conductive structs which correspond to the plurality of second conductive deformable crossbeams. The plurality of first conductive deformable crossbeams and the plurality of second conductive deformable crossbeams are arranged around a circle of the deformable aperture ring, and each first conductive deformable crossbeam and each second conductive deformable crossbeam are spaced from each other. The plurality of first conductive structs and the plurality of second conductive structs are arranged around the circle of the deformable aperture ring, and each first conductive struct and each second conductive struct are spaced from each other. The plurality of third conductive structs and the plurality of fourth conductive structs are arranged around the circle of the deformable aperture ring, and each third conductive struct and each fourth conductive struct are spaced from each other. When electrostatic attraction occurs between the conductive deformable crossbeam and one adjacent conductive struct, and electrostatic repulsion occurs between the conductive deformable crossbeam and the other adjacent conductive struct in each group, the first conductive deformable crossbeams and the second conductive deformable crossbeams may have opposite charges, the first conductive structs and the second conductive structs may have opposite charges, and the third conductive structs and the fourth conductive structs may have opposite charges. Optionally, in each group, an angle is formed between an inner side of the flat part of the conductive deformable crossbeam and an inner side of one adjacent conductive struct which are opposite, and the flat part may be parallel with an inner side of the other adjacent conductive struct which is opposite to the flat part. When electrostatic attraction occurs between the conductive deformable crossbeam and one adjacent conductive struct, a distance therebetween may decrease, electrostatic repulsion may occur between the conductive deformable crossbeam and the other adjacent conductive struct, and a distance between the conductive deformable crossbeam and the other adjacent conductive struct may be increased. When the conductive deformable crossbeam and the conductive structs are electrified, the conductive deformable crossbeam may sustain two forces with a same direction at a same time, one is an electrostatic attractive force and the other is an electrostatic repulsive force, where the electrostatic attraction occurs between the conductive deformable crossbeam and the one adjacent conductive struct which has an angle with the flat part of the conductive deformable crossbeam, and the electrostatic repulsion occurs between the conductive deformable crossbeam and the other adjacent conductive struct which is parallel with the flat part of conductive deformable crossbeam. Under these two forces, the conductive deformable crossbeams may move faster, the aperture may be adjusted faster, and the conductive deformable crossbeams may rotate towards one direction. When the conductive deformable crossbeam and the conductive structs are electrified, the conductive deformable crossbeam may approach one adjacent conductive struct gradually and be away from the other adjacent conductive struct, so that almost all the conductive deformable crossbeams can move towards one direction. And when the conductive structs take few charges, the conductive deformable crossbeams can move rotationally and a change of an area of the inner bore of the deformable aperture ring may be maximum.

Optionally, an angle is formed between an inner side of the flat part of the conductive deformable crossbeam and an inner side of the conductive struct which are opposite in each group. When electrostatic attraction occurs between the conductive deformable crossbeam and the conductive struct, a distance therebetween may decrease. During a process that the conductive struct attracts the conductive deformable crossbeam, an external part of the conductive deformable crossbeam nearest to the conductive struct may rotationally stretch the deformable aperture ring first due to the electrostatic attraction, and then an inner part of the conductive deformable crossbeam far away from the conductive struct may rotationally stretch the deformable aperture ring due to the electrostatic attraction. In such, the conductive deformable crossbeam may be attracted and an area of the inner bore of the deformable aperture ring may be changed greatly.

Optionally, the angle between the inner side of the flat part of the conductive deformable crossbeam and the inner side of the conductive struct which are opposite in each group may range from 1° to 60°. Optionally, the angle between the inner side of the flat part of the conductive deformable crossbeam and the inner side of the conductive struct which are opposite in each group may range from 5° to 50°. The smaller the angle is, the less the deformable aperture ring is rotationally stretched and the less the area of the inner bore is changed; and vice versa.

Optionally, a dielectric layer may be formed on inner sides of the conductive deformable crossbeam and the conductive struct which are opposite in each group. The dielectric layer may include silicon oxide, a high-K dielectric material or a low-K dielectric material. During the interattraction process between the conductive struct and the conductive deformable crossbeam, the dielectric layer may prevent wipeout of charges effectively.

Optionally, the deformable aperture ring may be annular.

Optionally, the deformable aperture ring may include an opaque stretchy material, which enables the deformable aperture ring to be stretched and to resume its original appearance so that the area of the inner bore of the deformable aperture ring can be changed at any time.

Optionally, anyone of the conductive deformable crossbeams, the conductive structs and the fixed parts may include a semiconductor material. Optionally, the conductive deformable crossbeams, the conductive structs and the fixed parts may include silicon. To increase the conductivity of the conductive deformable crossbeams and the conductive structs, they may include various doped silicon. In some embodiments, the fixed parts may include silicon dioxide.

Optionally, the device for adjusting aperture may have a thickness ranging from 1 μm to 1000 μm. In some embodiments, the device for adjusting aperture may have a thickness ranging from 10 μm to 50 μm. The smaller the thickness is, the smaller the size of the device is. A smaller size may be benefit to thermal radiation during the operation of the device.

Optionally, the device for adjusting aperture may include one or more adjustable power supply devices and one or more charge removing devices. The one or more adjustable power supply devices may be configured to provide charges to the conductive deformable crossbeams and the conductive structs. The one or more charge removing devices may be configured to remove charges on the conductive deformable crossbeams and the conductive structs. Charge amount on the conductive deformable crossbeams and the conductive structs can be controlled by the one or more adjustable power supply devices, so that an area variation of the inner bore of the deformable aperture ring may be controlled accurately. When there is no need to change the area of the inner bore, charges on the conductive deformable crossbeams and the conductive structs may be removed, so that the deformable aperture ring may resume its original appearance.

According to one embodiment of the present disclosure, a method for manufacturing an MEMS based device for adjusting aperture is provided, including:

providing a semiconductor substrate;

etching an upper layer of the semiconductor substrate by dry etching or wet etching to form multiple groups of conductive deformable crossbeams and conductive structs, one or more fixed parts and a central struct, where the central struct is disposed in the center of the multiple groups of conductive deformable crossbeams and conductive structs, in each group of conductive deformable crossbeam and conductive struct, each conductive deformable crossbeam corresponds to an adjacent conductive struct, the conductive deformable crossbeams and the conductive structs are arranged around the central struct, each conductive deformable crossbeam and each conductive struct are spaced from each other, external edges of the conductive deformable crossbeams are fixedly connected with the fixed parts, and the conductive structs are fixedly connected with the fixed parts and remain stationary;

adhering a plate on an upper surface of the semiconductor substrate;

thinning a lower layer of the semiconductor substrate, releasing the multiple groups of conductive deformable crossbeams and conductive structs to enable the conductive deformable crossbeams to be suspended in the air;

forming an opaque deformable aperture ring around the central struct, an external edge of the deformable aperture ring being fixedly connected with inner edges of the conductive deformable cross beams; and removing the plate and the central struct.

By attraction of opposite charges between the conductive deformable crossbeams and the conductive structs, the conductive deformable crossbeams move relatively to the conductive structs gradually, so that the inner edges of the conductive deformable crossbeams drive the external edge of the deformable aperture ring to be stretched in a radial direction and drive the deformable aperture ring to rotate around the center thereof clockwise or anticlockwise. As a result, an area of the inner bore of the deformable aperture ring is changed and an aperture adjusting function is reached. The conductive deformable crossbeams are suspended in the air, and the external edges thereof are fixedly connected with the fixed parts and remain stationary. The conductive structs are fixedly connected with the fixed parts and remain stationary. The fixed parts may improve the stability and accuracy of adjusting the area of the inner bore of the deformable aperture ring, and provide convenience for the assembly of the MEMS based device for adjusting aperture.

Optionally, the method may further include: before thinning the lower layer of the semiconductor substrate, depositing a dielectric layer on a side wall of the conductive deformable crossbeams and the conductive structs; and depositing a dielectric layer between any two adjacent fixed parts. In some embodiments, the dielectric layer may include silicon oxide, a high-K dielectric material or a low-K dielectric material. During an interattraction process between the conductive struct and the conductive deformable crossbeam, the dielectric layer may prevent wipeout of charges effectively.

Optionally, the semiconductor substrate may be a Silicon-On-Insulator (SOI) substrate. The upper layer of the semiconductor substrate may include a top silicon layer of the SOI substrate and the lower layer of the semiconductor substrate may include a buried layer and a bottom semiconductor layer of the SOI substrate. During a manufacturing process, the conductive deformable crossbeams and the conductive structs may be formed on the top silicon layer; and during a subsequent thinning process, the buried layer and the bottom semiconductor layer may be removed to release the conductive deformable crossbeams and the conductive structs, which may be convenient for controlling the processes. Besides, the SOI substrate may reduce parasitic capacitance.

Optionally, the method may further include: before thinning the lower layer of the semiconductor substrate, forming a metal interconnect and a pad on the conductive deformable crossbeams, the conductive structs or the fixed parts. The metal interconnect and the pad may play an effective role in providing charges to the conductive deformable crossbeams and the conductive structs or removing charges thereon.

Optionally, the method may further include: after removing the plate and the central struct, forming an electric connection among the pad, an adjustable power supply device and a charge removing device in an external circuit through lead wires.

Charge amount on the conductive deformable crossbeams and the conductive structs can be controlled by the one or more adjustable power supply devices, so that an area variation of the inner bore of the deformable aperture ring may be controlled accurately. When there is no need to change the area of the inner bore, charges on the conductive deformable crossbeams and the conductive structs may be removed, so that the deformable aperture ring may resume to its original appearance.

Optionally, during the process of etching the upper layer of the semiconductor substrate by dry etching or wet etching to form the multiple groups of conductive deformable crossbeams and conductive structs, the one or more fixed parts and the central struct, the multiple groups of conductive deformable crossbeams and the conductive structs may be symmetrically arranged around the central struct. In some embodiments, the multiple groups of conductive deformable crossbeams and the conductive structs may be arranged around a circle of the deformable aperture ring and rotationally symmetric with respect to center of the deformable aperture ring. When rotationally stretching the deformable aperture ring, the conductive deformable crossbeams and conductive structs in the rotationally symmetric arrangement enable every side of the deformable aperture ring to share averaged force, which may prevent the deformable aperture ring being damaged and keep the center thereof unchanged.

Optionally, during the process of etching the upper layer of the semiconductor substrate by dry etching or wet etching to form the multiple groups of conductive deformable crossbeams and conductive structs, the one or more fixed parts and the central struct, along a radial direction of the central struct outwardly, a distance between the conductive deformable crossbeam and the conductive struct in each group may decrease gradually. During a process that the conductive struct attracts the conductive deformable crossbeam, an external part of the conductive deformable crossbeam nearest to the conductive struct may be attracted approaching the conductive struct or in contact with the conductive struct first due to electrostatic attraction, and the deformable aperture ring is somewhat rotationally stretched. Then, under a gradually increased electrostatic attraction force, an inner part of the conductive deformable crossbeam far away from the conductive struct may gradually approach the conductive struct, so that the deformable aperture ring is further rotationally stretched. In such, the conductive deformable crossbeam may be attracted under limited electric potential difference and the area of the inner bore of the deformable aperture ring may be changed greatly.

Optionally, during the process of etching the upper layer of the semiconductor substrate by dry etching or wet etching to form the multiple groups of conductive deformable crossbeams and conductive structs, the one or more fixed parts and the central struct, each of the conductive deformable crossbeams may take a shape of sickle which includes a bending part and a flat part. During a process that the conductive struct attracts the conductive deformable crossbeam, the bending part can rotationally stretch the deformable aperture ring at utmost, so that the area of the inner bore of the deformable aperture ring is changed greatly.

Optionally, during the process of etching the upper layer of the semiconductor substrate by dry etching or wet etching to form the multiple groups of conductive deformable crossbeams and conductive structs, the one or more fixed parts and the central struct, along a radial direction of the central struct, each conductive deformable crossbeam may have a flat side. Optionally, a cross section of the conductive deformable crossbeam may be a parallel tetrahedron structure which is long and narrow in a vertical direction and a process for manufacturing the conductive deformable crossbeam is simple.

Optionally, during the process of etching the upper layer of the semiconductor substrate by dry etching or wet etching to form the multiple groups of conductive deformable crossbeams and conductive structs, the one or more fixed parts and the central struct, the conductive deformable crossbeams may include a plurality of first conductive deformable crossbeams and a plurality of second conductive deformable crossbeams, and the conductive structs may include a plurality of first conductive structs which correspond to the plurality of first conductive deformable crossbeams and a plurality of second conductive structs which correspond to the plurality of second conductive deformable crossbeams. The plurality of first conductive deformable crossbeams and the plurality of second conductive deformable crossbeams are arranged around the central struct, and each first conductive deformable crossbeam and each second conductive deformable crossbeam are spaced from each other. The plurality of first conductive structs and the plurality of second conductive structs are arranged around the central struct, and each first conductive struct and each second conductive struct are spaced from each other. In such, the conductive deformable crossbeam has opposite charges with one adjacent conductive struct and has like charges with the other adjacent conductive struct. Therefore, almost all the conductive structs attract their corresponding conductive deformable crossbeams disposed on a same side of them, which ensures the deformable aperture ring to be rotationally stretched towards a same direction, and this is benefit to a change of the aperture and to the stability of the center of the deformable aperture ring.

Optionally, during the process of etching the upper layer of the semiconductor substrate by dry etching or wet etching to form the multiple groups of conductive deformable crossbeams and conductive structs, the one or more fixed parts and the central struct, an angle between an inner side of the flat part of the conductive deformable crossbeam and an inner side of the conductive struct which are opposite in each group may range from 1° to 60°. Optionally, the angle between the inner side of the flat part of the conductive deformable crossbeam and the inner side of the conductive struct which are opposite in each group may range from 5° to 50°. The smaller the angle is, the less the deformable and the central struct is rotationally stretched and the less the aperture is changed; and vice versa.

Optionally, forming the opaque deformable aperture ring around the central struct may include: injecting drops of heated opaque plastic around the central struct; molding heated opaque plastic on a surface of the semiconductor substrate after thinning by employing a casting module to form the opaque deformable aperture ring; fixedly connecting an external edge of the opaque deformable aperture ring on the inner edges of the conductive deformable crossbeams; and removing the casting module. The casting module may have a smooth flat surface.

Optionally, the opaque deformable aperture ring may be annular and the central struct may be disposed in the inner bore of the deformable aperture ring. In some embodiments, the area of the inner bore of the deformable aperture ring may depend on the diameter of the central struct.

Optionally, after thinning the lower layer of the semiconductor substrate, the MEMS based device for adjusting aperture may have a thickness ranging from 1 µm to 1000 µm. In some embodiments, the MEMS based device for adjusting aperture may have a thickness ranging from 10 µm to 50 µm. The smaller the thickness is, the smaller the size of the device is. A smaller size may be benefit to thermal radiation during the operation of the device.

BRIEF DESCRIPTION OF THE DRAWINGS

FIG. 1 schematically illustrates a flow chart of a method for manufacturing a MEMS based device for adjusting aperture in the present disclosure;

DETAILED DESCRIPTION OF THE DISCLOSURE

Figure 2:
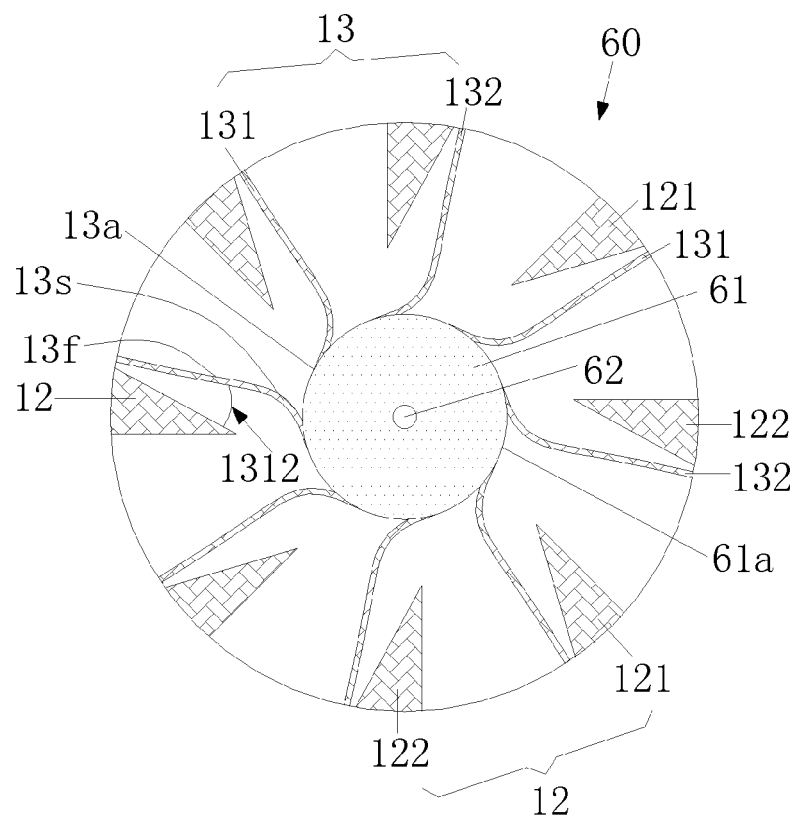
FIG. 2 schematically illustrates a vertical view of a MEMS based device for adjusting aperture according to a first embodiment of the present disclosure.

In order to clarify the objects, characteristics and advantages of the disclosure, embodiments of present disclosure will be described in detail in conjunction with accompanying drawings.

In one embodiment of the present disclosure, an MEMS based device for adjusting aperture is provided, including:
an opaque deformable aperture ring;
multiple groups of conductive deformable crossbeams and conductive structs, where in each group, each conductive deformable crossbeam corresponds to an adjacent conductive struct, the conductive deformable crossbeams and the conductive structs are arranged around the deformable aperture ring, each conductive deformable crossbeam and each conductive struct are spaced from each other, the conductive deformable crossbeams are suspended in the air, and inner edges of the conductive deformable crossbeams are fixedly connected with an external edge of the deformable aperture ring; and one or more fixed parts, where external edges of the conductive deformable crossbeams are fixedly connected with the fixed parts, and the conductive structs are fixedly connected with the fixed parts and remain stationary.

Electrostatic force between the conductive deformable crossbeam and the conductive struct in each group enables the conductive deformable crossbeam to move relatively to the conductive struct, so that the deformable aperture ring is stretched and rotates clockwise or anticlockwise. As a result, an area of the inner bore of the deformable aperture ring may be changed.

In some embodiments, the multiple groups of conductive deformable crossbeams and conductive structs are symmetrically arranged around the deformable aperture ring. Along a radial direction of the deformable aperture ring outwardly, a distance between the conductive deformable crossbeam and the conductive struct in each group may decrease gradually. Each of the conductive deformable crossbeams may take a shape of sickle which includes a bending part and a flat part. An inner edge of the bending part is fixedly connected with the external edge of the deformable aperture ring.

In some embodiments, along a radial direction of the deformable aperture ring, the conductive deformable crossbeam may be a parallelepiped.

In some embodiments, the conductive deformable crossbeams may include a plurality of first conductive deformable crossbeams and a plurality of second conductive deformable crossbeams, and the conductive structs may include a plurality of first conductive structs which correspond to the plurality of first conductive deformable crossbeams and a plurality of second conductive structs which correspond to the plurality of second conductive deformable crossbeams. The plurality of first conductive deformable crossbeams and the plurality of second conductive deformable crossbeams are arranged around the deformable aperture ring, and each first conductive deformable crossbeam and each second conductive deformable crossbeam are spaced from each other. The plurality of first conductive structs and the plurality of second conductive structs are arranged around the deformable aperture ring, and each first conductive struct and each second conductive struct are spaced from each other. When the conductive deformable crossbeam and the conductive struct in each group have opposite charges, the first conductive deformable crossbeam and the second conductive deformable crossbeam may have opposite charges, and the first conductive struct and the second conductive struct may have opposite charges.

In some embodiments, in each group of the conductive deformable crossbeam and the conductive struct, each conductive deformable crossbeam corresponds to one adjacent conductive struct. The conductive deformable crossbeams may include a plurality of first conductive deformable crossbeams and a plurality of second conductive deformable crossbeams, and the conductive structs may include a plurality of first conductive structs which correspond to the plurality of first conductive deformable crossbeams and a plurality of second conductive structs which correspond to the plurality of second conductive deformable crossbeams. The plurality of first conductive deformable crossbeams and the plurality of second conductive deformable crossbeams are arranged around a circle of the deformable aperture ring, and each first conductive deformable crossbeam and each second conductive deformable crossbeam are spaced from each other. The plurality of first conductive structs and the plurality of second conductive structs are arranged around the circle of the deformable aperture ring, and each first conductive struct and each second conductive struct are spaced from each other. When electrostatic repulsion occurs between the conductive deformable crossbeam and the conductive struct in each group, the first conductive deformable crossbeams and the second conductive deformable crossbeams may have opposite charges, and the first conductive structs and the second conductive structs may have opposite charges. In some embodiments, an inner side of the flat part of the conductive deformable crossbeam may be parallel with an inner side of the conductive struct which is opposite to the inner side of the flat part. When electrostatic repulsion occurs between the conductive deformable crossbeam and the conductive struct, a distance therebetween may be increased.

In some embodiments, in each group of the conductive deformable crossbeam and the conductive struct, each conductive deformable crossbeam corresponds to two adjacent conductive structs which are disposed on two sides of the corresponding conductive deformable crossbeam. The conductive deformable crossbeams may include a plurality of first conductive deformable crossbeams and a plurality of second conductive deformable crossbeams, and the conductive structs may include a plurality of first conductive structs and a plurality of third conductive structs which correspond to the plurality of first conductive deformable crossbeams and a plurality of second conductive structs and a plurality of fourth conductive structs which correspond to the plurality of second conductive deformable crossbeams. The plurality of first conductive deformable crossbeams and the plurality of second conductive deformable crossbeams are arranged around a circle of the deformable aperture ring, and each first conductive deformable crossbeam and each second conductive deformable crossbeam are spaced from each other. The plurality of first conductive structs and the plurality of second conductive structs are arranged around the circle of the deformable aperture ring, and each first conductive struct and each second conductive struct are spaced from each other. The plurality of third conductive structs and the plurality of fourth conductive structs are arranged around the circle of the deformable aperture ring, and each third conductive struct and each fourth conductive struct are spaced from each other. When electrostatic attraction occurs between the conductive deformable crossbeam and one adjacent conductive struct, and electrostatic repulsion occurs between the conductive deformable crossbeam and the other adjacent conductive struct in each group, the first conductive deformable crossbeams and the second conductive deformable crossbeams may have opposite charges, the first conductive structs and the second conductive structs may have opposite charges, and the third conductive structs and the fourth conductive structs may have opposite charges. Optionally, in each group, an angle is formed between an inner side of the flat part of the conductive deformable crossbeam and an inner side of one adjacent conductive struct which are opposite, and the flat part may be parallel with an inner side of the other adjacent conductive struct which is opposite to the flat part. When electrostatic attraction occurs between the conductive deformable crossbeam and one adjacent conductive struct, a distance therebetween may decrease, electrostatic repulsion may occur between the conductive deformable crossbeam and the other adjacent conductive struct, and a distance between the conductive deformable crossbeam and the other adjacent conductive struct may be increased.

In above embodiments, an angle is formed between an inner side of the flat part of the conductive deformable crossbeam and an inner side of the conductive struct which are opposite in each group. The angle between the inner side of the flat part of the conductive deformable crossbeam and the inner side of the conductive struct which are opposite in each group may range from 1° to 60°, preferably from 5° to 50°. When electrostatic attraction occurs between the conductive deformable crossbeam and the conductive struct, a distance therebetween may decrease. It is well known to those skilled in the art that, the greater the number of groups of the conductive deformable crossbeams and the conductive structs is, the smaller the angle is.

A dielectric layer including silicon oxide may be formed on a side wall of the conductive deformable crossbeams and the conductive structs. The deformable aperture ring may be annular and include an opaque stretchy material. The conductive deformable crossbeams, the conductive structs and the fixed parts may include silicon. The MEMS based device for adjusting aperture may have a thickness ranging from 1 μm to 1000 μm, preferably 10 μm to 100 μm.

In some embodiments, the MEMS based device for adjusting aperture may include one or more adjustable power supply devices and one or more charge removing devices. The one or more adjustable power supply devices may be configured to provide charges to the conductive deformable crossbeams and the conductive structs. The one or more charge removing devices may be configured to remove charges on the conductive deformable crossbeams and the conductive structs.

In one embodiment of the present disclosure, a method for manufacturing an MEMS based device for adjusting aperture is provided. FIG. 1 schematically illustrates a flow chart of a method for manufacturing a MEMS based device for adjusting aperture in the present disclosure. The method includes:

S20, providing a semiconductor substrate;

S21, etching an upper layer of the semiconductor substrate by dry etching or wet etching to form multiple groups of conductive deformable crossbeams and conductive structs, one or more fixed parts and a central struct, where the central struct is disposed in the center of the multiple groups of conductive deformable crossbeams and conductive structs, in each group of conductive deformable crossbeam and conductive struct, each conductive deformable crossbeam corresponds to an adjacent conductive struct, the conductive deformable crossbeams and the conductive structs are arranged around the central struct, each conductive deformable crossbeam and each conductive struct are spaced from each other, external edges of the conductive deformable crossbeams are fixedly connected with the fixed parts, and the conductive structs are fixedly connected with the fixed parts and remain stationary;

S22, adhering a plate on an upper surface of the semiconductor substrate;

S23, thinning a lower layer of the semiconductor substrate, releasing the multiple groups of conductive deformable crossbeams and conductive structs to enable the conductive deformable crossbeams to be suspended in the air;

S24, forming an opaque deformable aperture ring around the central struct, an external edge of the opaque deformable aperture ring being fixedly connected with inner edges of the conductive deformable cross beams; and S25, removing the plate and the central struct.

In one embodiment, the method for manufacturing an MEMS based device for adjusting aperture may include:
  providing a SOI substrate, the SOI substrate including a bottom semiconductor layer, a buried layer and a top silicon layer from bottom to top;
  etching the top silicon layer by dry etching or wet etching to form multiple groups of conductive deformable crossbeams and conductive structs, a plurality of fixed parts and a central struct, where the central struct is disposed in the center of the multiple groups of conductive deformable crossbeams and conductive structs, in each group of conductive deformable crossbeam and conductive struct, each conductive deformable crossbeam corresponds to an adjacent conductive struct, the conductive deformable crossbeams and the conductive structs are arranged around the central struct, each conductive deformable crossbeam and each conductive struct are spaced from each other, the multiple groups of conductive deformable crossbeams and the conductive structs are symmetrically arranged around the central struct, along a radial direction of the central struct outwardly, a distance between the conductive deformable crossbeam and the conductive struct in each group may decrease gradually, each of the conductive deformable crossbeams may take a shape of sickle which includes a bending part and a flat part, an angle between an inner side of the flat part of the conductive deformable crossbeam and an inner side of the conductive struct which are opposite in each group may range from 1° to 60°, preferably from 5° to 50°, external edges of the conductive deformable crossbeams are fixedly connected with the fixed parts, and the conductive structs are fixedly connected with the fixed parts and remain stationary;
  forming a groove between the adjacent fixed parts by an etching process;
  depositing a dielectric layer including silicon oxide on the top silicon layer, coating a photoresist layer on the dielectric layer and performing an etching process on the photoresist layer, where silicon oxide on a side wall of the conductive deformable crossbeams and the conductive structs, and silicon oxide between the adjacent fixed parts are remained;
  forming a metal interconnect and a pad on the conductive deformable crossbeams, the conductive structs and the fixed parts;
  adhering a plate on an upper surface of the semiconductor substrate, the plate having a flat surface;
  removing the bottom semiconductor layer and the buried layer and releasing the multiple groups of conductive deformable crossbeams and conductive structs to enable the conductive deformable crossbeams to be suspended in the air and enable the MEMS based device for adjusting aperture to have a thickness ranging from 1 μm to 1000 μm, preferably from 10 μm to 100 μm;
  injecting drops of heated opaque plastic around the central struct, molding the heated opaque plastic on a lower surface of the top silicon layer by employing a casting module having a flat surface to form an opaque deformable aperture ring; fixedly connecting an external edge of the opaque deformable aperture ring with the inner edges of the conductive deformable crossbeams, and removing the casting module; and removing the plate and the central struct, and forming an electric connection among the pad, an adjustable power supply device and a charge removing device in an external circuit through lead wires.

In some embodiments, for brevity, the deformable aperture ring is illustrated as a loop. In vertical views in embodiments of the present disclosure, the center of the deformable aperture ring is disposed on the center of the loop. It should be noted that, in other embodiments, the deformable aperture ring may be not a standard loop. The following embodiments may be used to explain the present disclosure but not used to limit the scope of the present disclosure.

FIG. 2 schematically illustrates a vertical view of a MEMS based device for adjusting aperture according to a first embodiment of the present disclosure. As shown in FIG. 2, the MEMS based device 60 for adjusting aperture may include an opaque deformable aperture ring 61 including an inner bore 62 in the center thereof, a plurality of conductive deformable crossbeams 13 and a plurality of conductive structs 12 which correspond to the plurality of conductive deformable crossbeams 13. The conductive deformable crossbeams 13 and the conductive structs 12 are arranged around the deformable aperture ring 61, and each conductive deformable crossbeam and each conductive struct are spaced from each other. The conductive deformable crossbeams 13 may be suspended in the air. Inner edges 13a of the conductive deformable crossbeams 13 are fixedly connected with an external edge 61a of the deformable aperture ring 61. When the conductive deformable crossbeams 13 and the conductive structs 12 have opposite charges, electrostatic attraction may occur, so that the conductive deformable crossbeams 13 may bend relative to the conductive structs 12 and the deformable aperture ring 61 is rotationally stretched and rotate anticlockwise. In such, the aperture of the deformable aperture ring 61 may be changed. In a practical aperture changing process, how much the deformable aperture ring 61 is rotationally stretched may be controlled by the number of charges on the conductive deformable crossbeams 13 and the conductive structs 12 which are provided by an adjustable power supply device, so that an area of the inner bore 62 is changed and the aperture variation is controlled.

As shown in FIG. 2, the conductive deformable crossbeams 13 include first conductive deformable crossbeams 131 and second conductive deformable crossbeams 132, and the conductive structs 12 include first conductive structs 121 which correspond to the first conductive deformable crossbeams 131 and second conductive structs 122 which correspond to the second conductive deformable crossbeams 132. When the conductive deformable crossbeams 13 and the conductive structs 12 have opposite charges, for example, the first conductive structs 121 and the second conductive deformable crossbeams 132 carry positive charges while the second conductive structs 122 and the first conductive deformable crossbeams 131 carry negative charges, the first and second conductive deformable crossbeams carry opposite charges, the first and second conductive structs carry opposite charges, and the first conductive deformable crossbeams 131 and the adjacent second conductive structs 122 carry like charges. Therefore, in an electrostatic attraction process, the first conductive deformable crossbeams 131 and the corresponding first conductive structs 121 may attract each other while the first conductive deformable crossbeams 131 and the second conductive structs 122 may not attract each other. In such, almost all the conductive deformable crossbeams 13 and the corresponding conductive structs 12 attract each other, which ensures a deformable aperture ring 61 to be rotationally stretched towards a same direction. In other embodiments, all the conductive structs 12 may have like charges, all the conductive deformable crossbeams 13 may have like charges, and the conductive structs 12 and the conductive deformable crossbeams 13 have opposite charges. As shown in FIG. 2, in some embodiments, the eight conductive deformable crossbeams and the eight conductive structs are arranged around a deformable aperture ring 61 and rotationally symmetric with respect to the deformable aperture ring 61. It is known to those skilled in the art that, in other embodiments, other even numbers of conductive deformable crossbeams and conductive structs may be arranged around the deformable aperture ring 61 and rotationally symmetric with respect to the deformable aperture ring 61.

By employing an adjustable power supply device to control charge amount on the conductive deformable crossbeams and the conductive structs or employing a charge removing device to remove charges thereon, the deformable aperture ring may rotationally contract, so that the area of the inner bore 62 may be changed. Specifically, under the action of the adjustable power supply device and the charge removing device, the conductive deformable crossbeams may bend and then an elastic restoring force may be generated. Under the elastic restoring force, the deformable aperture ring may be driven to move towards a direction opposite to the bending direction of the conductive deformable crossbeams, that is, the deformable aperture ring rotationally contracts clockwise, so that the area of the inner bore 62 of the deformable aperture ring may be changed.

As shown in FIG. 2, each conductive deformable crossbeam 13 takes a shape of sickle which includes a bending part 13s and a flat part 13f. The bending part 13s is fixedly connected with external edges 61a of the deformable aperture ring 61. An angle 1312 between an inner side of the flat part 13f of each conductive deformable crossbeam 13 and an inner side of a conductive struct 12 which are opposite is 20°. Along a radial direction of the deformable aperture ring 61 outwardly, a distance between the conductive deformable crossbeam 13 and the conductive struct 12 in each group may decrease gradually.

In other embodiments, the angle 1312 between the inner side of the flat part 13f of each conductive deformable crossbeam 13 and the inner side of the conductive struct 12 which are opposite may range from 1° to 60°, for example, 5°, 15°, 20°, 30°, 40°, 50°, 55°, preferably from 5° to 50°, but the angle is not limited to these values.

In some embodiments, the deformable aperture ring 61 may include an opaque stretchy material, and the conductive deformable crossbeams 13 and the conductive structs 12 may include silicon. In other embodiments, the conductive deformable crossbeams 13 and the conductive structs 12 may include other semiconductor materials, such as germanium, a doped semiconductor material, a semiconductor material of binary compound or a semiconductor material of ternary compound. A dielectric layer may be formed on a side wall of the conductive deformable crossbeam 13 and the conductive struct 12 in each group.

Figure 3:
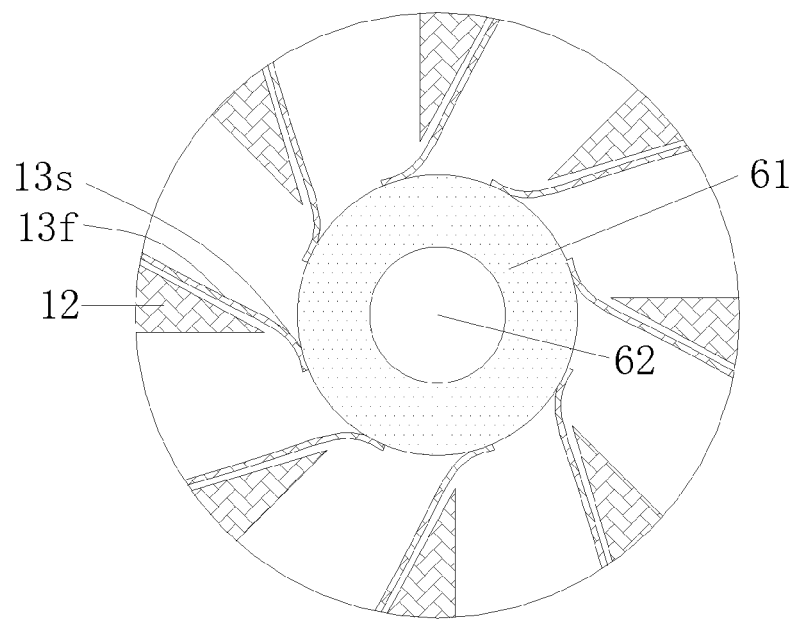
FIG. 3 schematically illustrates a vertical view of an aperture change of a deformable aperture ring in the MEMS based device for adjusting aperture shown in FIG. 2.

FIG. 3 schematically illustrates a vertical view of an aperture change of a deformable aperture ring in the MEMS based device for adjusting aperture shown in FIG. 2. When opposite charges are provided for the conductive deformable crossbeams 13 and the conductive structs 12 by the adjustable power supply device, the flat part 13f of each conductive deformable crossbeam 13 is nearest to the conductive struct 12, thus, a portion of the flat part 13f which is away from the deformable aperture ring 61 may be attracted by the conductive struct 12 first. A distance between the intersection of the flat part 13f and the bending part 13s and the conductive struct 12 decreases gradually and the whole conductive deformable crossbeam 13 is attracted by the conductive struct 12 entirely at last, thus, the aperture variation of the deformable aperture ring 61 may be maximum. Therefore, in the embodiments in the present disclosure, although the conductive deformable crossbeams 13 and the conductive structs 12 have relatively few charges, the aperture variation of the deformable aperture ring 61 can be maximized, thereby reducing power consumption. Referring to FIGS. 2 and 3, after the deformable aperture ring 61 is rotationally stretched anticlockwise, the area of the inner bore 62 of the deformable aperture ring 61 is changed.

Figure 4:
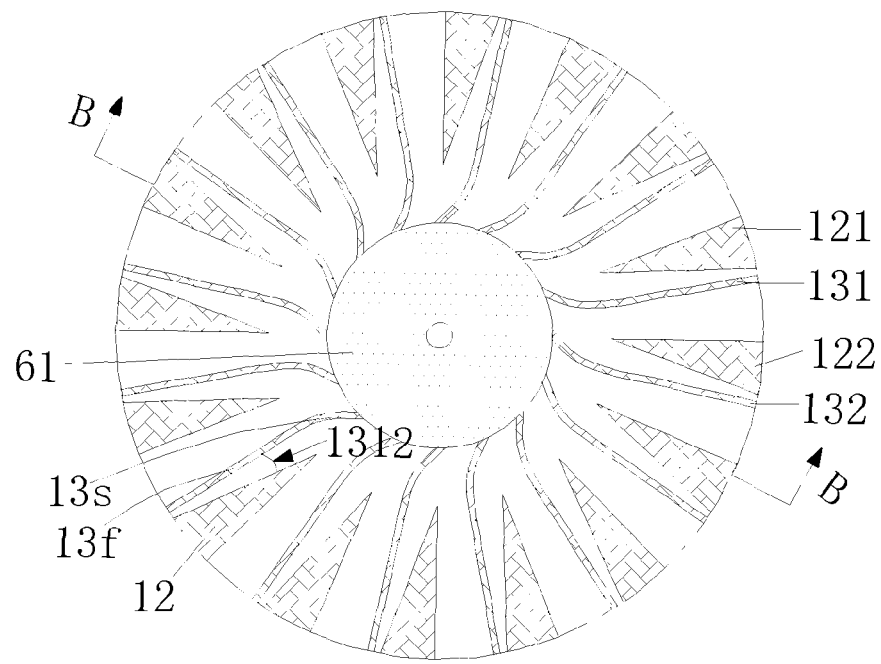
FIG. 4 schematically illustrates a vertical view of a MEMS based device for adjusting aperture according to a second embodiment of the present disclosure.

FIG. 4 schematically illustrates a vertical view of a MEMS based device for adjusting aperture according to a second embodiment of the present disclosure. The second embodiment is almost the same with the first embodiment. The only difference between the first embodiment and the second embodiment is that, in the second embodiment, the MEMS based device for adjusting aperture includes eight first conductive deformable crossbeams 131, eight second conductive deformable crossbeams 132, eight first conductive structs 121 and eight second conductive structs 122. An angle 1312 between an inner side of a flat part 13f of each conductive deformable crossbeam 13 and an inner side of a conductive struct 12 which are opposite is 10°.

Figure 5:
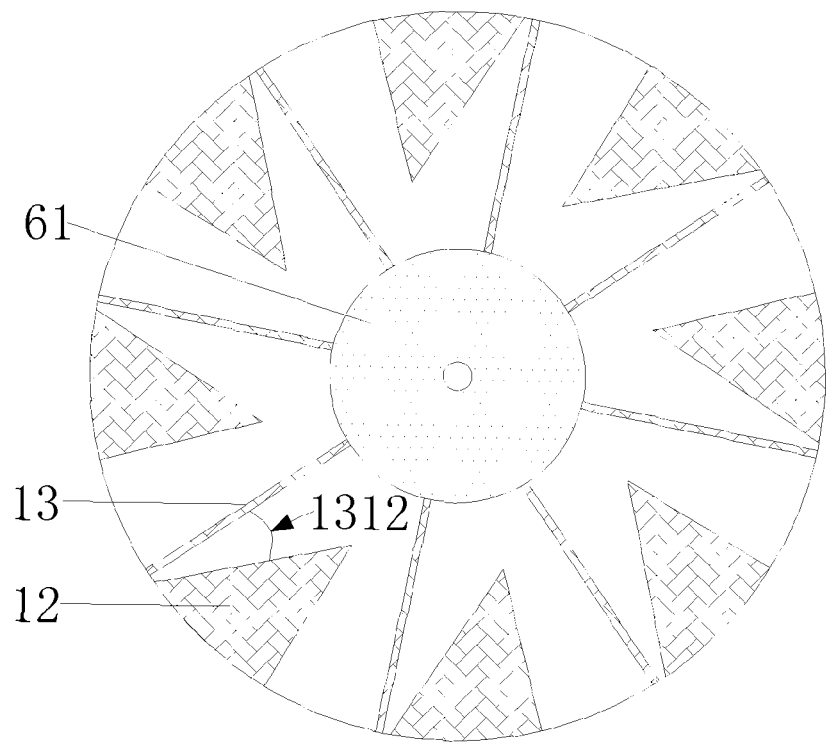
FIG. 5 schematically illustrates a vertical view of a MEMS based device for adjusting aperture according to a third embodiment of the present disclosure.

FIG. 5 schematically illustrates a vertical view of a MEMS based device for adjusting aperture according to a third embodiment of the present disclosure. The third embodiment is almost the same with the first embodiment. Differences between the first embodiment and the fourth embodiment are described as follows. Along a radial direction of the deformable aperture ring 61, each conductive deformable crossbeam 13 has a flat side, and an angle 1312 between an inner side of each conductive deformable crossbeam 13 and an inner side of a conductive struct 12 which are opposite is 30°.

Figure 6:
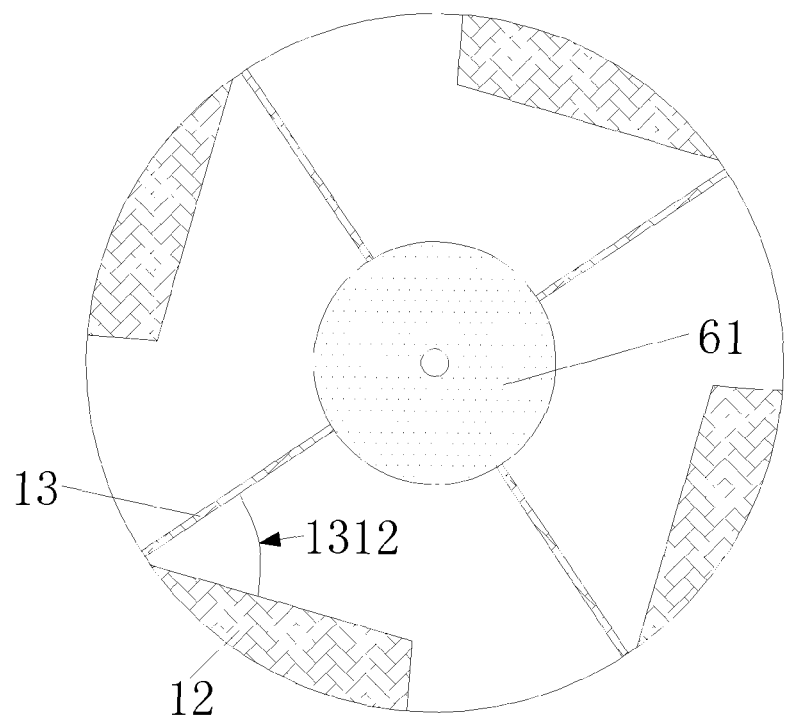
FIG. 6 schematically illustrates a vertical view of a MEMS based device for adjusting aperture according to a fourth embodiment of the present disclosure.

FIG. 6 schematically illustrates a vertical view of a MEMS based device for adjusting aperture according to a fourth embodiment of the present disclosure. The fourth embodiment is almost the same with the first embodiment. Differences between the first embodiment and the fifth embodiment are described as follows. In the fourth embodiment, the MEMS based device for adjusting aperture includes four conductive deformable crossbeams 13 and four conductive structs 12. Each conductive deformable crossbeam 13 has a flat side, and an angle 1312 between an inner side of each conductive deformable crossbeam 13 and an inner side of a conductive struct 12 which are opposite is 60°.

Figure 7:
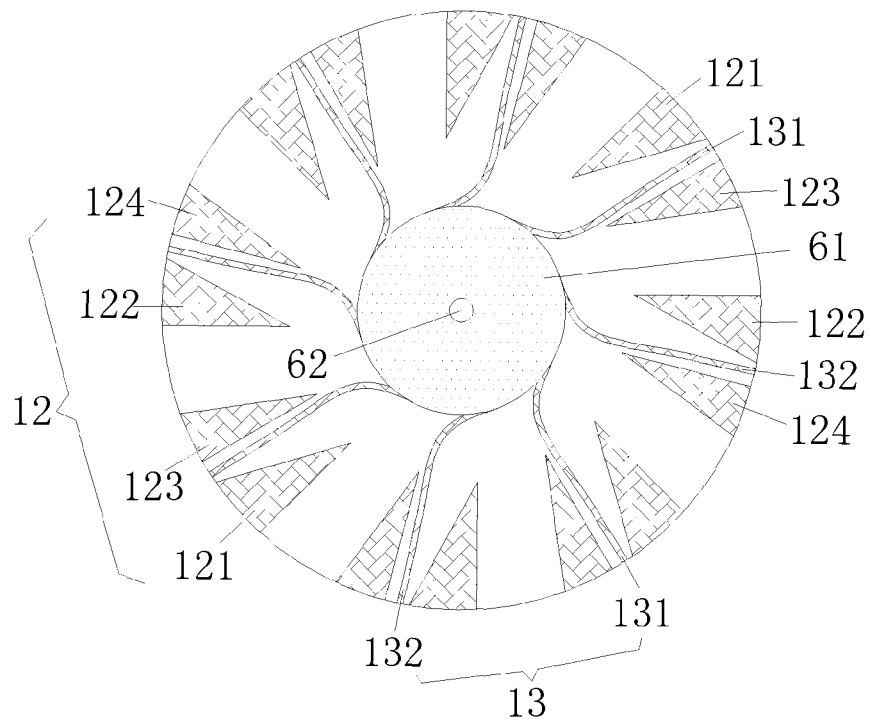
FIG. 7 schematically illustrates a vertical view of a MEMS based device for adjusting aperture according to a fifth embodiment of the present disclosure.

FIG. 7 schematically illustrates a vertical view of a MEMS based device for adjusting aperture according to a fifth embodiment of the present disclosure. The fifth embodiment is almost the same with the first embodiment. Differences between the first embodiment and the fifth embodiment are described as follows. In the fifth embodiment, each conductive deformable crossbeam 13 may include a first conductive deformable crossbeam 131 and a second conductive deformable crossbeam 132, and each conductive struct 12 may include a first conductive struct 121, a second conductive struct 122, a third conductive struct 123 and a fourth conductive struct 124. The first conductive deformable crossbeam 131 correspond to the first conductive struct 121 and the third conductive struct 123 which are arranged on two sides of the first conductive deformable crossbeam 131 respectively. An angle is formed between an inner side of a flat part of the conductive deformable crossbeam 131 and an inner side of the conductive struct 121 which are opposite. The flat part of the conductive deformable crossbeam 131 is parallel with an inner side of the conductive struct 123 which is opposite to the flat part. The second conductive deformable crossbeam 132 correspond to the second conductive struct 122 and the fourth conductive struct 124 which are arranged on two sides of the second conductive deformable crossbeam 132 respectively. An angle is formed between an inner side of a flat part of the conductive deformable crossbeam 132 and an inner side of the conductive struct 122 which are opposite. The flat part of the conductive deformable crossbeam 132 is parallel with an inner side of the conductive struct 124 which is opposite to the flat part. The first conductive structs 121 and the second conductive structs 122 are arranged around the deformable aperture ring 61, and each first conductive struct 121 and each second conductive struct 122 are spaced from each other. The third conductive structs 123 and the fourth conductive structs 124 are arranged around the deformable aperture ring 61, and each third conductive struct 123 and each fourth conductive struct 124 are spaced from each other. The first conductive deformable crossbeams 131 and the second conductive deformable crossbeams 132 are arranged around the deformable aperture ring 61, and each first conductive deformable crossbeam 131 and each second conductive deformable crossbeam 132 are spaced from each other. When the first conductive deformable crossbeams 131 carry negative charges, the first conductive structs 121, the second conductive deformable crossbeams 132 and the fourth conductive structs 124 may carry positive charges, and the third conductive structs 123 and the second conductive structs 122 may carry negative charges. Thus, under electrostatic attraction and electrostatic repulsion between the conductive structs and the conductive deformable crossbeams, a distance between the first conductive deformable crossbeams 131 and the first conductive structs 121 may decrease, a distance between the first conductive deformable crossbeams 131 and the third conductive structs 123 may be increased, a distance between the second conductive deformable crossbeams 132 and the second conductive structs 122 may decrease, and a distance between the second conductive deformable crossbeams 132 and the fourth conductive structs 124 may be increased. The deformable aperture ring 61 may be rotationally stretched through the movement of the conductive deformable crossbeams, thereby the area of the inner bore 62 of the deformable aperture ring 61 may be changed.

In some embodiments, the first conductive deformable crossbeams 131 and the second conductive deformable crossbeams 132 may carry negative charges, the first conductive structs 121 and the second conductive structs 122 may carry positive charges, and the third conductive structs 123 and the fourth conductive structs 124 may carry negative charges. It is known to those skilled in the art that, in some embodiments, the first conductive deformable crossbeams 131 and the second conductive deformable crossbeams 132 may carry positive charges, the first conductive structs 121 and the second conductive structs 122 may carry negative charges, and the third conductive structs 123 and the fourth conductive structs 124 may carry positive charges.

Figure 8:
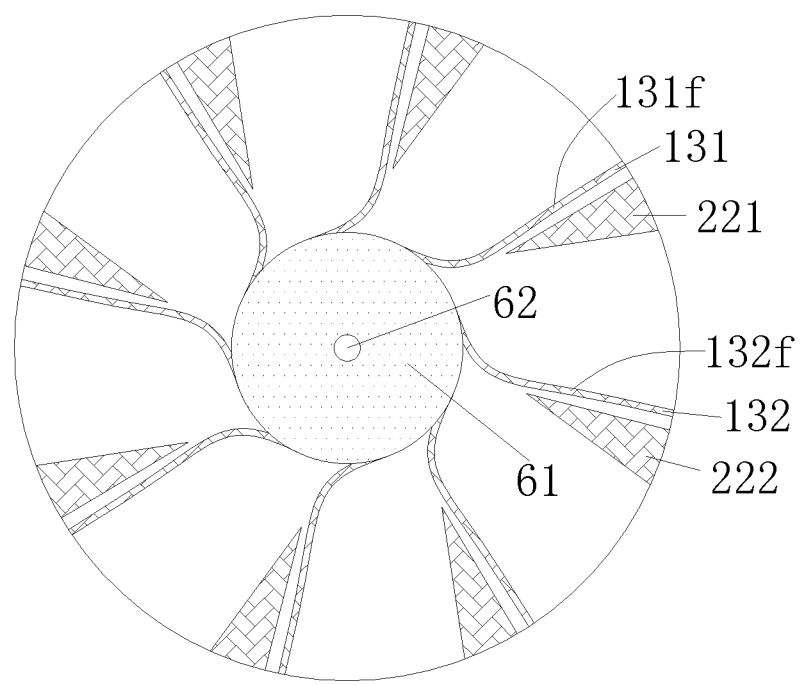
FIG. 8 schematically illustrates a vertical view of a MEMS based device for adjusting aperture according to a sixth embodiment of the present disclosure.

FIG. 8 schematically illustrates a vertical view of a MEMS based device for adjusting aperture according to a sixth embodiment of the present disclosure. The sixth embodiment is almost the same with the first embodiment. Differences between the first embodiment and the sixth embodiment are described as follows. In the sixth embodiment, a flat part 131f of a first conductive deformable crossbeam 131 is parallel with an inner side of a first conductive struct 221 which is opposite to the flat part 131f and a flat part 132f of a second conductive deformable crossbeam 132 is parallel with an inner side of a second conductive struct 222 which is opposite to the flat part 132f. When the first conductive deformable crossbeams 131 carry negative charges, the first conductive structs 221 may carry negative charges, and the second conductive deformable crossbeams 132 and the second conductive structs 222 may carry positive charges. Thus, under electrostatic repulsion, a distance between the first conductive deformable crossbeam 131 and the first conductive structs 221 may be increased, and a distance between the second conductive deformable crossbeam 132 and the second conductive structs 222 may be increased. The deformable aperture ring 61 may be rotationally stretched through the movement of the conductive deformable crossbeams, thereby the area of the inner bore 62 of the deformable aperture ring 61 may be changed. In other embodiments, when the first conductive deformable crossbeams 131 carry positive charges, the first conductive structs 221 may carry positive charges, and the second conductive deformable crossbeams 132 and the second conductive structs 222 may carry negative charges.

Figure 9:
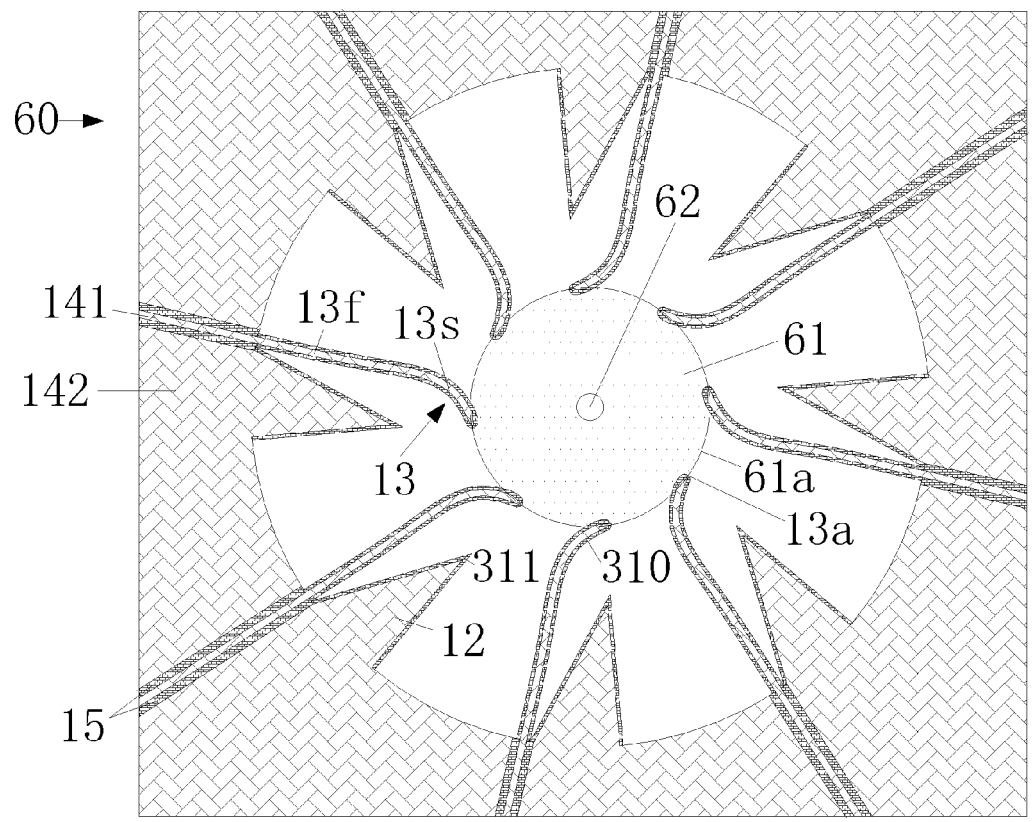
FIG. 9 schematically illustrates a vertical view of conductive deformable crossbeams and conductive structs fixedly connected with fixed parts in the MEMS based device for adjusting aperture according to the first embodiment of the present disclosure.

FIG. 9 schematically illustrates a vertical view of conductive deformable crossbeams and conductive structs fixedly connected with fixed parts in the MEMS based device for adjusting aperture according to the first embodiment of the present disclosure. As shown in FIG. 9, external edges 13b of conductive deformable crossbeams 13 may be fixedly connected with fixed parts 141, and external edges 12b of conductive structs 12 may be fixedly connected with fixed parts 142. A dielectric layer 15, having silicon dioxide, may be disposed between the fixed parts 141 and 142 to adhere the fixed parts 141 with the fixed parts 142, so that the conductive deformable crossbeams 13 and the conductive structs 12 may keep a stable distance relative to each other. In such, a change of the center of a deformable aperture ring 61 and a change of the area of the inner bore thereof, resulted from a change of the relative distance between the conductive deformable crossbeams 13 and the conductive structs 12, may be avoided.

Figure 10:
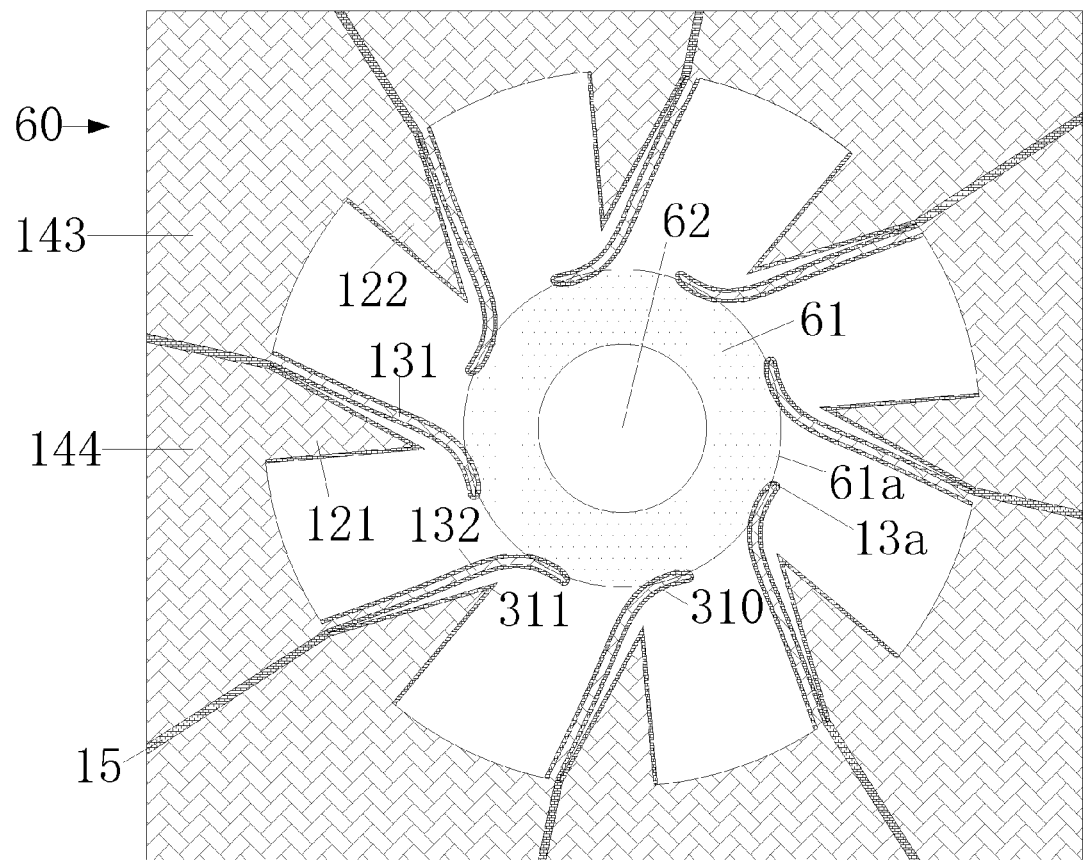
FIG. 10 schematically illustrates a vertical view of conductive deformable crossbeams and conductive structs fixedly connected with fixed parts in the MEMS based device for adjusting aperture according to one embodiment of the present disclosure.

FIG. 10 schematically illustrates a vertical view of conductive deformable crossbeams and conductive structs fixedly connected with fixed parts in the MEMS based device for adjusting aperture according to one embodiment of the present disclosure. Differences between FIG. 9 and FIG. 10 are described as follows. As shown in FIG. 10, under electrostatic attraction, the conductive deformable crossbeams 13 approach the conductive structs 12, so that the deformable aperture ring 61 is rotationally stretched anticlockwise and the area of the inner bore 62 of the deformable aperture ring 61 may be changed. Fixed parts 143 are fixedly connected with the second conductive structs 122 and the first conductive deformable crossbeams 131, and fixed parts 144 are fixedly connected with the first conductive structs 121 and the second conductive deformable crossbeams 132. The fixed parts 143 and 144 have opposite charges, so that the conductive deformable crossbeam and the conductive struct in each group have opposite charges. For example, in a group formed by the first conductive deformable crossbeam 131 and the first conductive struct 121, they have opposite charges. And the conductive deformable crossbeam and the conductive struct which are fixedly connected with a same fixed part may have like charges. Therefore, the deformable aperture ring may be rotationally stretched towards a same direction.

It is known to those skilled in the art, in some embodiment, when the fixed part 14 includes silicon, an interconnect and a pad which are electrically connected with the conductive deformable crossbeams 13 may be disposed on the fixed part 14 or on the conductive deformable crossbeams 13, and an interconnect and a pad which are electrically connected with the conductive structs 12 may be disposed on the fixed part 14 or on the conductive structs 12.

Figure 11:
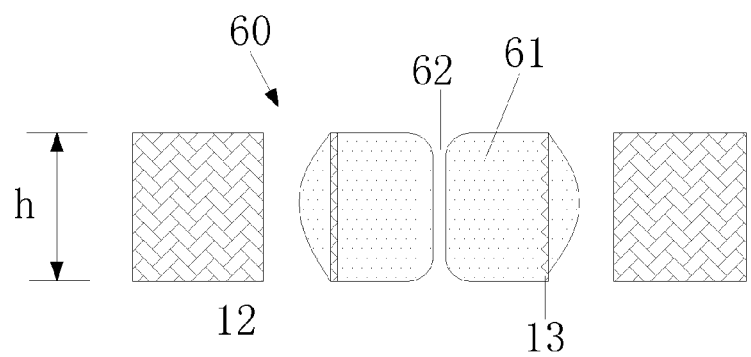
FIGS. 11 and 12 schematically illustrate a sectional view of the MEMS based device for adjusting aperture along a B-B line shown in FIG. 4 according to one embodiment of the present disclosure.
Figure 12:
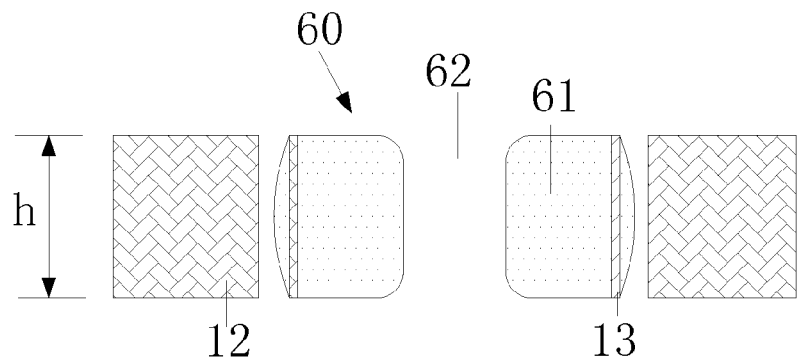

FIGS. 11 and 12 schematically illustrate a sectional view of the MEMS based device for adjusting aperture along a B-B line shown in FIG. 4 according to one embodiment of the present disclosure. As shown in FIG. 11, an MEMS based device 60 for adjusting aperture has a thickness h of 50 μm. A deformable aperture ring 61 is annular and has an inner bore 62 in the center thereof. The deformable aperture ring 61 is fixedly connected with conductive deformable crossbeams 13. When conductive structs 12 and the conductive deformable crossbeams 13 carry opposite charges, the conductive deformable crossbeams 13 and the deformable aperture ring 61 are rotationally stretched clockwise or anticlockwise around the center of the deformable aperture ring 61. Referring to FIG. 12, the conductive deformable crossbeams 13 stretch the deformable aperture ring 61 on two ends of the deformable aperture ring 61, respectively, so as to change the area of the inner bore 62 of the deformable aperture ring 61. By controlling charge amount on the conductive deformable crossbeams 13 and the conductive structs 12, the aperture variation of the deformable aperture ring 61 may be adjusted. In other embodiments, the MEMS based device 60 for adjusting aperture may have a thickness h of 20 μm.

In other embodiments, a thickness of the MEMS based device for adjusting aperture may range from 1 μm to 1000 μm, preferably from 10 μm to 100 μm. In practice, the MEMS based device 60 for adjusting aperture may have a required thickness through a polishing process or a chemical mechanical planarization process.

Thereafter, a method for manufacturing an MEMS based device for adjusting aperture is described in detail in conjunction with accompany drawings.

Figure 13:
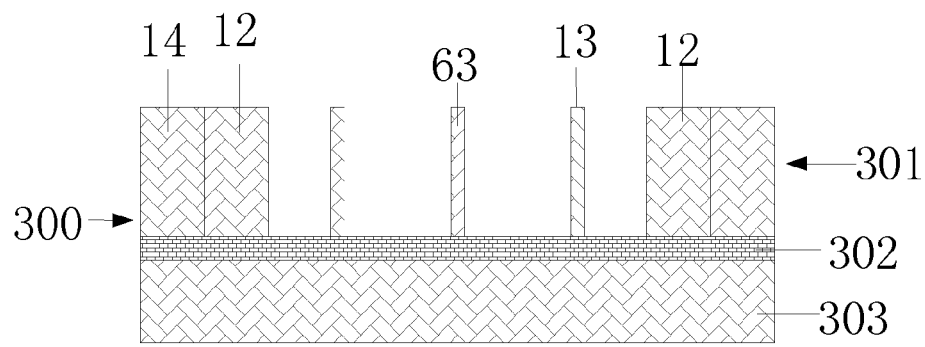
FIGS. 13 to 18 schematically illustrate sectional views of intermediate structures of a method for manufacturing a MEMS based device for adjusting aperture according to one embodiment of the present disclosure.

FIGS. 13 to 18 schematically illustrate sectional views of a method for manufacturing an MEMS based device for adjusting aperture according to one embodiment of the present disclosure. As shown in FIG. 13, a SOI substrate 300 is provided, which includes a top silicon layer 301, a buried layer 302 and a bottom silicon layer 303 from top to bottom. The top silicon layer 301 is etched by dry etching or wet etching to form multiple groups of conductive deformable crossbeams 13 and conductive structs 12, a plurality of fixed parts 14 and a central struct. The central struct is disposed in the center of the conductive deformable crossbeams 13 and conductive structs 12. In each group of the conductive deformable crossbeam 13 and the conductive struct 12, each conductive deformable crossbeam 13 corresponds to an adjacent conductive struct 12, the conductive deformable crossbeams 13 and the conductive structs 12 are symmetrically arranged around the central struct 63, each conductive deformable crossbeam and each conductive struct are spaced from each other, and the conductive structs 12 are fixedly connected with the fixed parts 14 and remain stationary. In FIG. 13, the conductive deformable crossbeams 13 and the conductive structs 12 are symmetrically arranged on two sides of the central struct 63.

Figure 14:
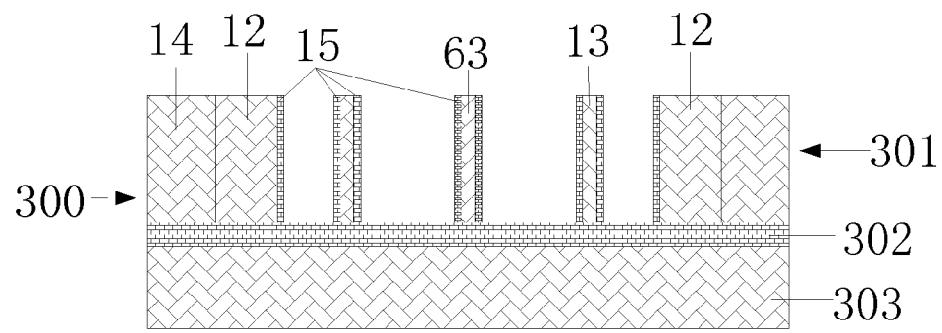

As shown in FIG. 14, a dielectric layer 15 including silicon oxide is deposited on the top silicon layer 301. A photoresist layer may be coated on the dielectric layer 13 and an etching process is performed on the photoresist layer almost similarly to FIG. 15. The differences between FIG. 13 and FIG. 14 are that, in FIG. 14, the dielectric layer 15 on a side wall of the conductive deformable crossbeams 13, the conductive structs 12, and the central struct 63 and silicon oxide between the adjacent fixed parts 14 are remained.

Figure 15:
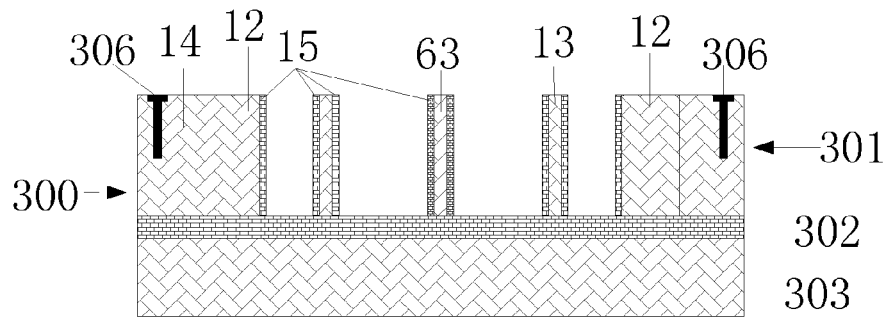

As shown in FIG. 15, a metal interconnect and a pad 306 are formed on the fixed parts 14. In some embodiments, a metal interconnect and a pad 306 may be formed on the conductive deformable crossbeams 13 and the conductive structs 12. A process for forming the metal interconnect and the pad 306 may be similar with a process for manufacturing a metal interconnect in an integrated circuit and not described in detail here.

Figure 16:
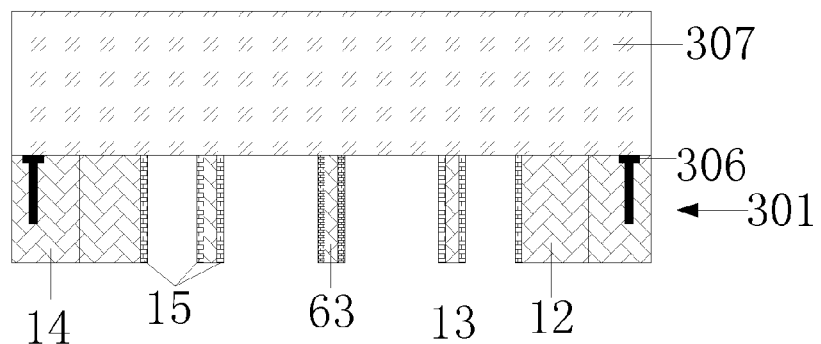

As shown in FIG. 16, a glass plate 307 is adhered on an upper surface of the conductive deformable crossbeams 13 and the conductive structs 12, where a surface of the glass plate 307 is flat. The bottom silicon layer 303 and the buried layer 302 are removed, and the multiple groups of conductive deformable crossbeams 13 and conductive structs 12 are released to enable the conductive deformable crossbeams 13 to be suspended in the air.

Figure 17:
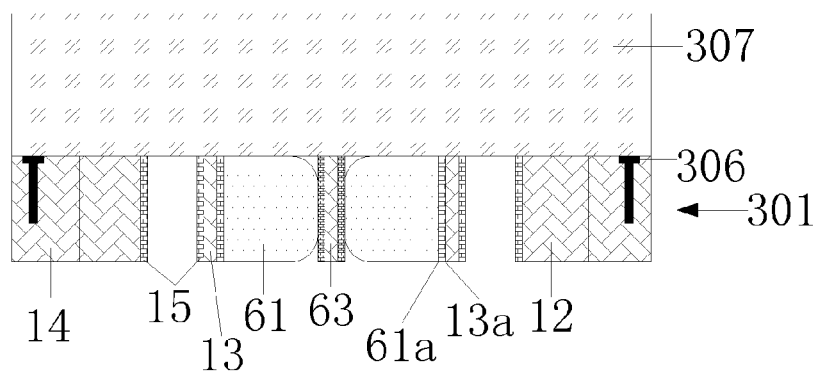

As shown in FIG. 17, drops of heated opaque plastic are injected around the central struct 306, the heated opaque plastic is molded on a lower surface of the top silicon layer 301 by employing a casting module having a flat surface to form a deformable aperture ring 61, external edges 61a of the deformable aperture ring 61 are fixedly connected with the inner edges 13a of the conductive deformable crossbeams 13, and the casting module is removed.

Figure 18:
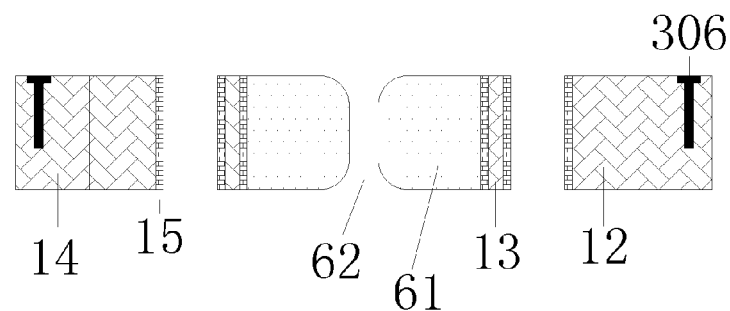

As shown in FIG. 18, the glass plate 307 and the central struct 63 are removed to form the MEMS based device for adjusting aperture.

It is known to those skilled in the art that, since FIG. 18 is a sectional view, it is not shown in FIG. 18 that, external edges of the conductive deformable crossbeams 13 are fixedly connected with the fixed parts 14.

Figure 19:
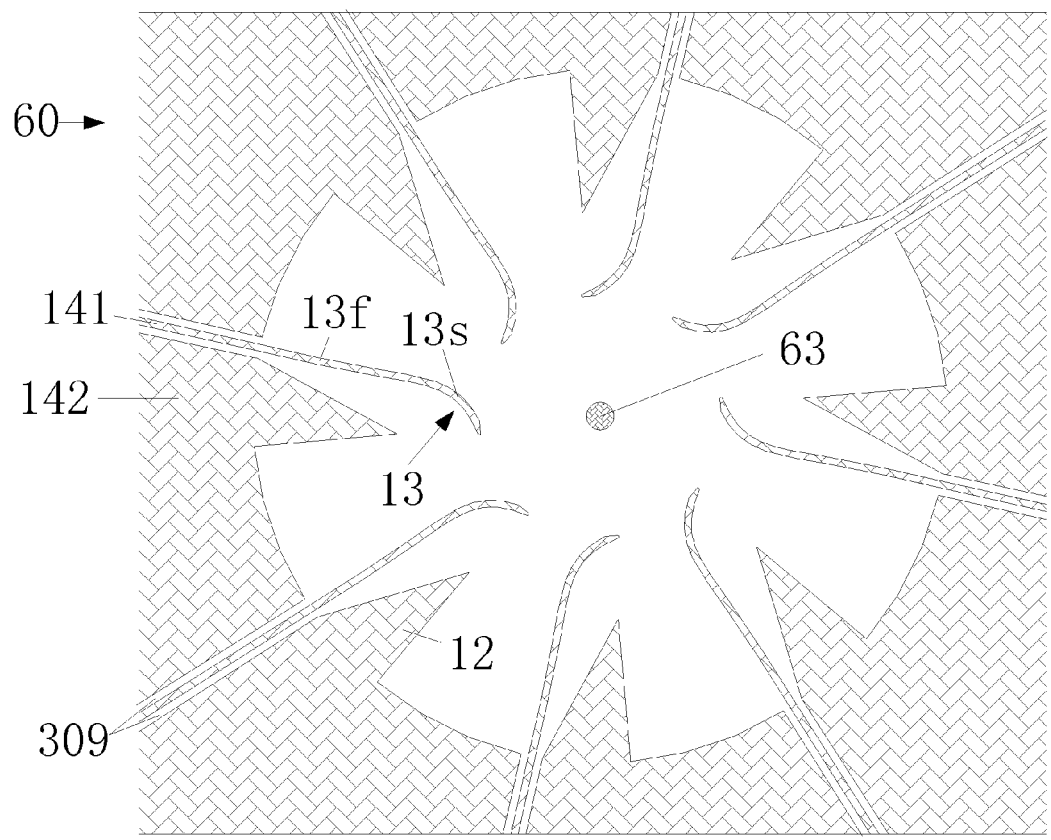
FIGS. 19 to 21 schematically illustrate vertical views of intermediate structures of a method for manufacturing a MEMS based device for adjusting aperture according to one embodiment of the present disclosure.
Figure 20:
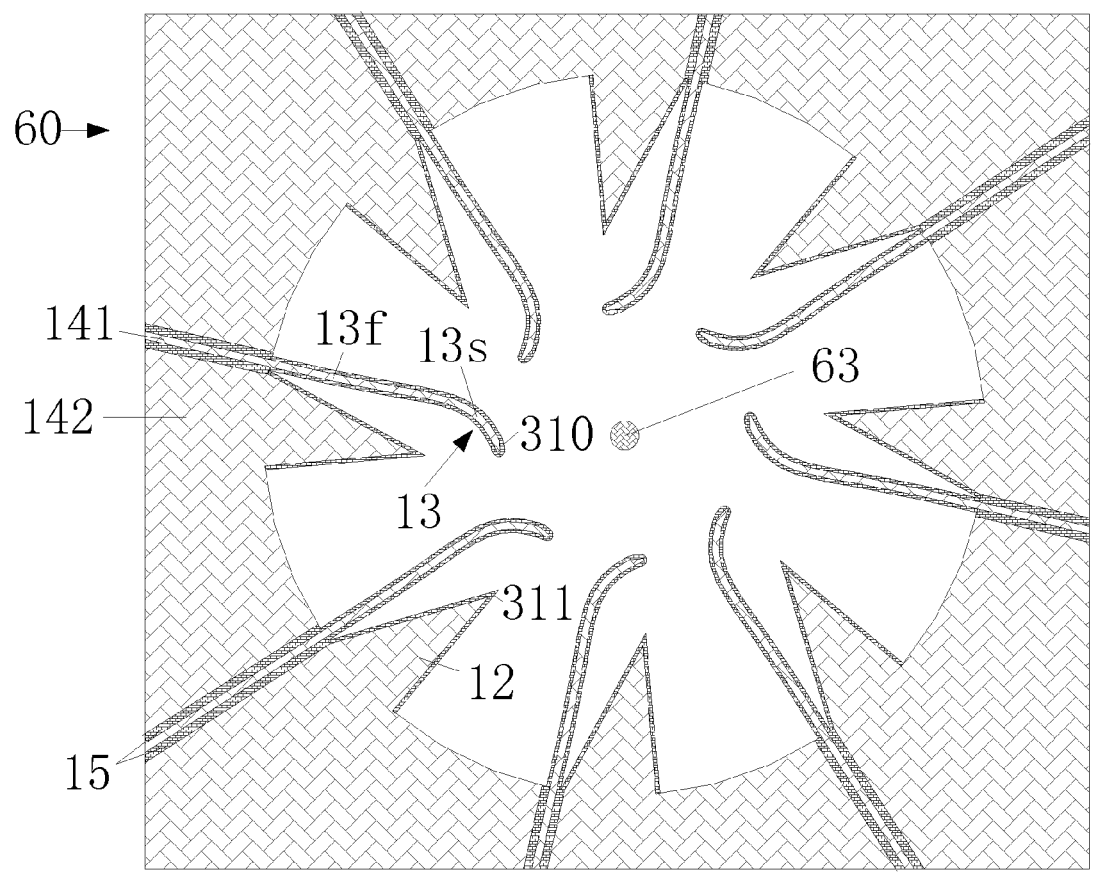
Figure 21:
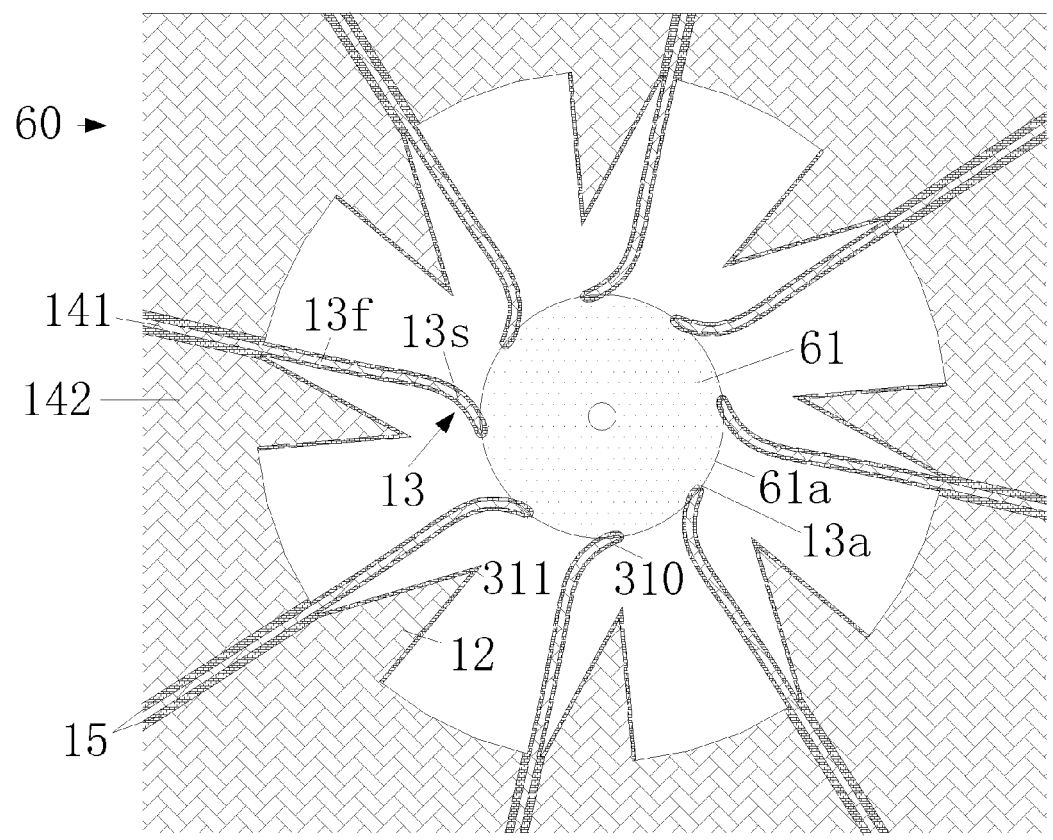

FIGS. 19 to 21 schematically illustrate vertical views of a method for manufacturing an MEMS based device for adjusting aperture according to one embodiment of the present disclosure and correspond to FIGS. 13 to 18. To show structures formed by the method conveniently, a lower layer of a substrate, a plate and a casting module are not shown in FIGS. 19 to 21. As shown in FIG. 19, a SOI substrate is provided, which includes a bottom silicon layer, a buried layer and a top silicon layer from bottom to top. The top silicon layer is etched by dry etching or wet etching to form eight groups of conductive deformable crossbeams 13 and conductive structs 12, a plurality of fixed parts 141 and 142 and a central struct 63. The central struct 63 is disposed in the center of the inner edges of the conductive deformable crossbeams 13. In each group of the conductive deformable crossbeam 13 and the conductive struct 12, each conductive deformable crossbeam 13 corresponds to an adjacent conductive struct 12, the conductive deformable crossbeams 13 and the conductive structs 12 are arranged around the central struct 63, each conductive deformable crossbeam 13 and each conductive struct 12 are spaced from each other, the eight groups of conductive deformable crossbeams 13 and the conductive structs 12 are symmetrically arranged around the central struct 63, along a radial direction of the central struct 63 outwardly, a distance between the conductive deformable crossbeam 13 and the conductive struct 12 in each group may decrease gradually, each conductive deformable crossbeam 13 may take a shape of sickle which includes a bending part 13s and a flat part 13f, an angle between an inner side of the flat part 13f and an inner side of the conductive struct 12 which are opposite in each group may be 15°, external edges of the conductive deformable crossbeams 13 are fixedly connected with the fixed parts 141, and the conductive structs 12 are fixedly connected with the fixed parts 142 and remain stationary. Besides, a groove 309 is formed between the adjacent fixed parts by an etching process.

As shown in FIG. 20, a dielectric layer including silicon oxide is deposited on the top silicon layer. A photoresist layer may be coated on the dielectric layer and an etching process is performed on the photoresist layer, remaining a dielectric layer 310 on a side wall of the conductive deformable crossbeams 13, a dielectric layer 311 on a side wall of the conductive structs 12 and a dielectric layer 15 between the adjacent fixed parts.

As shown in FIG. 21, a glass plate is adhered on an upper surface of the conductive deformable crossbeams 13 and the conductive structs 12, where a surface of the glass plate is flat. The bottom silicon layer and the buried layer are removed, and the eight groups of conductive deformable crossbeams 13 and conductive structs 12 are released to enable the conductive deformable crossbeams 13 to be suspended in the air. Drops of heated opaque plastic are injected around the central struct 63, the heated opaque plastic is molded on a lower surface of the top silicon layer by employing a casting module having a flat surface, external edges 61a of the deformable aperture ring 61 are fixedly connected with the inner edges 13a of the conductive deformable crossbeams 13, and the casting module, the glass plate and the central struct 63 are removed to form the deformable aperture ring 61.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure.

What is claimed is:

1. A micro-electro-mechanical system based device for adjusting aperture, comprising:
   an opaque deformable aperture ring;
   multiple groups of conductive deformable crossbeams and conductive structs, where in each group, each conductive deformable crossbeam corresponds to an adjacent conductive struct, the conductive deformable crossbeams and the conductive structs are arranged around the deformable aperture ring, each conductive deformable crossbeam and each conductive struct are spaced from each other, the conductive deformable crossbeams are suspended in the air, and inner edges of the conductive deformable crossbeams are fixedly connected with an external edge of the deformable aperture ring; and
   one or more fixed parts, where external edges of the conductive deformable crossbeams are fixedly connected with the fixed parts, and the conductive structs are fixedly connected with the fixed parts and remain stationary,
   where electrostatic force between the conductive deformable crossbeam and the conductive struct in each group enables the conductive deformable crossbeam to move relatively to the conductive struct, so that the deformable aperture ring is stretched and rotates clockwise or anticlockwise, and further an area of an inner bore of the deformable aperture ring is changed.

2. The micro-electro-mechanical system based device for adjusting aperture according to claim 1, wherein the multiple groups of conductive deformable crossbeams and conductive structs are symmetrically arranged around the deformable aperture ring.

3. The micro-electro-mechanical system based device for adjusting aperture according to claim 1, wherein along a radial direction of the deformable aperture ring outwardly, a distance between the conductive deformable crossbeam and the conductive struct in each group decreases gradually.

4. The micro-electro-mechanical system based device for adjusting aperture according to claim 1, wherein each of the conductive deformable crossbeams takes a shape of sickle which comprises a bending part and a flat part, and an inner edge of the bending part is fixedly connected with the external edge of the deformable aperture ring.

5. The micro-electro-mechanical system based device for adjusting aperture according to claim 1, wherein along a radial direction of the deformable aperture ring, each conductive deformable crossbeam has a flat side.

6. The micro-electro-mechanical system based device for adjusting aperture according to claim 1, wherein the conductive deformable crossbeams comprise a plurality of first conductive deformable crossbeams and a plurality of second conductive deformable crossbeams, and the conductive structs comprise a plurality of first conductive structs which correspond to the plurality of first conductive deformable crossbeams and a plurality of second conductive structs which correspond to the plurality of second conductive deformable crossbeams, where the plurality of first conductive deformable crossbeams and the plurality of second conductive deformable crossbeams are arranged around the deformable aperture ring, each first conductive deformable crossbeam and each second conductive deformable crossbeam are spaced from each other, the plurality of first conductive structs and the plurality of second conductive structs are arranged around the deformable aperture ring, and each first conductive struct and each second conductive struct are spaced from each other; and when the conductive deformable crossbeam and the conductive struct in each group have opposite charges, the first conductive deformable crossbeam and the second conductive deformable crossbeam have opposite charges and the first conductive struct and the second conductive struct have opposite charges.

7. The micro-electro-mechanical system based device for adjusting aperture according to claim 6, wherein an angle is formed between an inner side of the flat part of the conductive deformable crossbeam and an inner side of the conductive struct which are opposite in each group, and when electrostatic attraction occurs between the conductive deformable crossbeam and the conductive struct, a distance therebetween decreases.

8. The micro-electro-mechanical system based device for adjusting aperture according to claim 1, wherein a dielectric layer is formed on inner sides of the conductive deformable crossbeam and the conductive struct which are opposite in each group.

9. The micro-electro-mechanical system based device for adjusting aperture according to claim 1, further comprising one or more adjustable power supply devices and one or more charge removing devices, wherein the one or more adjustable power supply devices are configured to provide charges to the conductive deformable crossbeams and the conductive structs, and the one or more charge removing devices are configured to remove charges on the conductive deformable crossbeams and the conductive structs.

10. A method for manufacturing a micro-electro-mechanical system based device for adjusting aperture, comprising:
providing a semiconductor substrate;
etching an upper layer of the semiconductor substrate by dry etching or wet etching to form multiple groups of conductive deformable crossbeams and conductive structs, one or more fixed parts and a central struct, where the central struct is disposed in the center of the conductive deformable crossbeams and the conductive structs, in each group of conductive deformable crossbeam and conductive struct, each conductive deformable crossbeam corresponds to an adjacent conductive struct, the conductive deformable crossbeams and the conductive structs are arranged around the central struct, each conductive deformable crossbeam and each conductive struct are spaced from each other, external edges of the conductive deformable crossbeams are fixedly connected with the fixed parts, and the conductive structs are fixedly connected with the fixed parts and remain stationary;
adhering a plate on an upper surface of the semiconductor substrate;
thinning a lower layer of the semiconductor substrate, releasing the multiple groups of conductive deformable crossbeams and conductive structs to enable the conductive deformable crossbeams to be suspended in the air;
forming an opaque deformable aperture ring around the central struct, an external edge of the deformable aperture ring being fixedly connected with inner edges of the conductive deformable cross beams; and
removing the plate.

11. The method according to claim 10, further comprising:
before thinning the lower layer of the semiconductor substrate, depositing a dielectric layer on a side wall of the conductive deformable crossbeams and the conductive structs; and depositing a dielectric layer between any two adjacent fixed parts.

12. The method according to claim 10, wherein the semiconductor substrate is a silicon-on-insulator substrate, wherein the upper layer of the semiconductor substrate comprises a top silicon layer of the silicon-on-insulator substrate and the lower layer of the semiconductor substrate comprises a buried layer and a bottom semiconductor layer of the silicon-on-insulator substrate.

13. The method according to claim 10, further comprising:
before thinning the lower layer of the semiconductor substrate, forming a metal interconnect and a pad on the conductive deformable crossbeams, the conductive structs or the fixed parts.

14. The method according to claim 10, wherein during the process of etching the upper layer of the semiconductor substrate by dry etching or wet etching to form the multiple groups of conductive deformable crossbeams and conductive structs, the one or more fixed parts and the central struct, the multiple groups of conductive deformable crossbeams and the conductive structs are symmetrically arranged around the central struct.

15. The method according to claim 10, wherein during the process of etching the upper layer of the semiconductor substrate by dry etching or wet etching to form the multiple groups of conductive deformable crossbeams and conductive structs, the one or more fixed parts and the central struct, along a radial direction of the deformable aperture ring outwardly, a distance between the conductive deformable crossbeam and the conductive struct in each group decreases gradually.

16. The method according to claim 10, wherein during the process of etching the upper layer of the semiconductor substrate by dry etching or wet etching to form the multiple groups of conductive deformable crossbeams and conductive structs, the one or more fixed parts and the central struct, each of the conductive deformable crossbeams takes a shape of sickle which comprises a bending part and a flat part.

17. The method according to claim 10, wherein during the process of etching the upper layer of the semiconductor substrate by dry etching or wet etching to form the multiple groups of conductive deformable crossbeams and conductive structs, the one or more fixed parts and the central struct, along a radial direction of the central struct, each conductive deformable crossbeam has a flat side.

18. The method according to claim 10, wherein during the process of etching the upper layer of the semiconductor substrate by dry etching or wet etching to form the multiple groups of conductive deformable crossbeams and conductive structs, the one or more fixed parts and the central struct, the conductive deformable crossbeams comprise a plurality of first conductive deformable crossbeams and a plurality of second conductive deformable crossbeams, and the conductive structs comprise a plurality of first conductive structs which correspond to the plurality of first conductive deformable crossbeams and a plurality of second conductive structs which correspond to the plurality of second conductive deformable crossbeams, where the plurality of first conductive deformable crossbeams and the plurality of second conductive deformable crossbeams are arranged around the central struct, each first conductive deformable crossbeam and each second conductive deformable crossbeam are spaced from each other, the plurality of first conductive structs and the plurality of second conductive structs are arranged around the central struct, and each first conductive struct and each second conductive struct are spaced from each other.

19. The method according to claim 10, wherein forming the deformable aperture ring around the central struct comprises:
injecting drops of heated opaque plastic around the central struct;
molding heated opaque plastic on a surface of the semiconductor substrate after thinning by employing a casting module to form the opaque deformable aperture ring;
fixedly connecting the external edge of the opaque deformable aperture ring with the inner edges of the conductive deformable crossbeams; and
removing the casting module.

20. The method according to claim 13, further comprising:
after removing the plate, forming an electric connection among the pad, an adjustable power supply device and a charge removing device in an external circuit through lead wires.

\* \* \* \* \*